(12) United States Patent
Kang et al.

(10) Patent No.: US 12,068,047 B2
(45) Date of Patent: Aug. 20, 2024

(54) MEMORY SYSTEM FOR PROGRAMMING DUMMY DATA TO A PORTION OF A STORAGE REGION IN A PROGRAM MODE

(71) Applicant: SAMSUNG ELECTRONICS CO., LTD., Suwon-si (KR)

(72) Inventors: Sukeun Kang, Seoul (KR); Junho Seo, Hwaseong-si (KR); Dogyeong Lee, Suwon-si (KR); Juwon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/535,771

(22) Filed: Nov. 26, 2021

(65) Prior Publication Data

US 2022/0238170 A1 Jul. 28, 2022

(30) Foreign Application Priority Data

Jan. 27, 2021 (KR) .......................... 10-2021-0011793

(51) Int. Cl.
*G11C 16/34* (2006.01)
*G11C 16/08* (2006.01)
*G11C 16/10* (2006.01)
*G11C 16/14* (2006.01)
*G11C 16/28* (2006.01)

(52) U.S. Cl.
CPC .......... *G11C 16/3495* (2013.01); *G11C 16/08* (2013.01); *G11C 16/102* (2013.01); *G11C 16/14* (2013.01); *G11C 16/28* (2013.01)

(58) Field of Classification Search
CPC ... G11C 16/3495; G11C 16/08; G11C 16/102; G11C 16/14; G11C 16/28; G11C 16/107; G11C 16/34; G11C 16/3404; G11C 16/3418; G11C 16/3422; G11C 16/3427; G11C 16/3436; G11C 16/3454; G11C 16/349

See application file for complete search history.

(56) References Cited

U.S. PATENT DOCUMENTS

| | | | |
|---|---|---|---|
| 9,123,422 B2 | 9/2015 | Yu et al. | |
| 9,147,500 B2 | 9/2015 | Kim et al. | |
| 9,165,670 B2 * | 10/2015 | Mekhanik | ............... G11C 16/28 |
| 9,741,444 B2 * | 8/2017 | Reusswig | ............... G11C 29/52 |
| 9,852,802 B2 * | 12/2017 | Yoo | ....................... G06F 3/0634 |
| 10,014,060 B2 * | 7/2018 | Tuers | .................. G11C 16/3427 |

(Continued)

FOREIGN PATENT DOCUMENTS

| KR | 10-2014-0011162 A | 1/2014 |
|---|---|---|
| KR | 10-2017-0030702 A | 3/2017 |

(Continued)

*Primary Examiner* — Anthan Tran
(74) *Attorney, Agent, or Firm* — Sughrue Mion, PLLC

(57) ABSTRACT

An operating method of a memory system includes storing normal data to a first storage area of a non-volatile memory in a first program mode among multiple program modes defined according to a number of bits stored in each memory cell; storing dummy data in the first storage area in at least one of the multiple program modes including the first program mode; and copying the normal data from the first storage area to a second storage area of the non-volatile memory based on dummy data stored in the first program mode.

18 Claims, 16 Drawing Sheets

(56) References Cited

U.S. PATENT DOCUMENTS

| | | | |
|---|---|---|---|
| 10,055,294 | B2 | 8/2018 | Hyun et al. |
| 10,073,660 | B2 | 9/2018 | Park et al. |
| 10,790,003 | B1 * | 9/2020 | Chen ................. G11C 11/40626 |
| 10,884,669 | B2 | 1/2021 | Lee |
| 2015/0355845 | A1 | 12/2015 | Lee et al. |
| 2018/0358098 | A1 | 12/2018 | Cha et al. |
| 2019/0130983 | A1 | 5/2019 | Singidi et al. |
| 2020/0118636 | A1 | 4/2020 | Athreya et al. |
| 2020/0118637 | A1 | 4/2020 | Natarajan et al. |
| 2022/0059172 | A1 | 2/2022 | Yu et al. |

FOREIGN PATENT DOCUMENTS

| | | |
|---|---|---|
| KR | 10-2018-0001303 A | 1/2018 |
| KR | 10-2020-0121654 A | 10/2020 |
| KR | 10-2020-0122875 A | 10/2020 |

* cited by examiner

FIG. 12A

PROGRAM MODE TABLE

| Type | WL | PROGRAM MODE |
|---|---|---|
| WEAK | WL1 | MLC |
| | WL2 | |
| NORMAL | WL3 | SLC |
| | WL4 | |
| BOUNDARY | WL5 | MLC |

FIG. 12B

EPI TABLE

| BLOCK ID | EPI |
|---|---|
| BLK1 | t1 |
| BLK2 | t2 |
| ... | ... |

MEMORY SYSTEM FOR PROGRAMMING DUMMY DATA TO A PORTION OF A STORAGE REGION IN A PROGRAM MODE

CROSS-REFERENCE TO RELATED APPLICATION

This application is based on and claims priority from Korean Patent Application No. 10-2021-0011793, filed on Jan. 27, 2021, in the Korean Intellectual Property Office, the disclosure of which is incorporated by reference herein in its entirety.

BACKGROUND

The embodiments relate to a memory system, and more particularly, to a memory system for programming dummy data in multiple program modes and an operating method thereof.

A memory system may include a memory controller and a memory device. The memory device may be a non-volatile memory device. As an example of a non-volatile memory device, a flash memory device may be used in a cellular phone, a digital camera, a personal digital assistant (PDA), a mobile computing system, a stationary computing system, and other devices. A flash memory device may include a plurality of blocks, and each of the blocks may include a plurality of pages. In a flash memory device, a time period until a program operation is performed on a block after an erase operation is performed on the block may be defined as an erase program interval (EPI). Due to the characteristics of a flash memory device, threshold voltage distribution characteristics of the flash memory device may be degraded when an EPI is long during a data write operation, and accordingly, the reliability of data may also be degraded.

SUMMARY

The embodiments of the inventive concept provide a memory system for increasing read reclaim performance by programming dummy data to a portion of a storage region in a program mode that is the same as a program mode in which normal data is programmed and an operating method thereof.

The embodiments of the inventive concept also provide a memory system for reducing a dummy data programming time by programming dummy data to a portion of a storage region in a program mode, in which a relatively small number of bits are stored in a memory cell, and an operating method thereof.

According to embodiments of the inventive concept, there is provided an operating method of a memory system. The operating method may include: storing normal data to a first storage area of a non-volatile memory in a first program mode among multiple program modes defined according to a number of bits stored in each memory cell; storing dummy data in the first storage area in at least one of the multiple program modes including the first program mode; and copying the normal data from the first storage area to a second storage area of the non-volatile memory based on dummy data stored in the first program mode.

According to another aspect of the inventive concept, there is provided a memory controller including a host interface configured to provide an interface with a host; and a program operation controller configured to control a non-volatile memory to store normal data received from the host to a first storage area in a first program mode among multiple program modes defined according to a number of bits stored in each memory cell, wherein the program operation controller is further configured to control the non-volatile memory to store dummy data to the first storage area in the multiple program modes.

According to a further aspect of the inventive concept, there is provided a memory system including a memory device including a first storage area and a second storage area; and a memory controller configured to control the memory device to store normal data received from a host to the first storage area in a first program mode among multiple program modes defined according to a number of bits stored in a memory cell and control the memory device to store dummy data to the first storage area in the first program mode and a second program mode that is different from the first program mode.

BRIEF DESCRIPTION OF DRAWINGS

The embodiments of the inventive concept will be more clearly understood from the following detailed description taken in conjunction with the accompanying drawings in which:

FIG. 12A shows a program mode table according to an embodiment;

FIG. 12B shows an EPI table according to an embodiment;

DETAILED DESCRIPTION

Hereinafter, various embodiments will be described with reference to the accompanying drawings. The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

Figure 1:
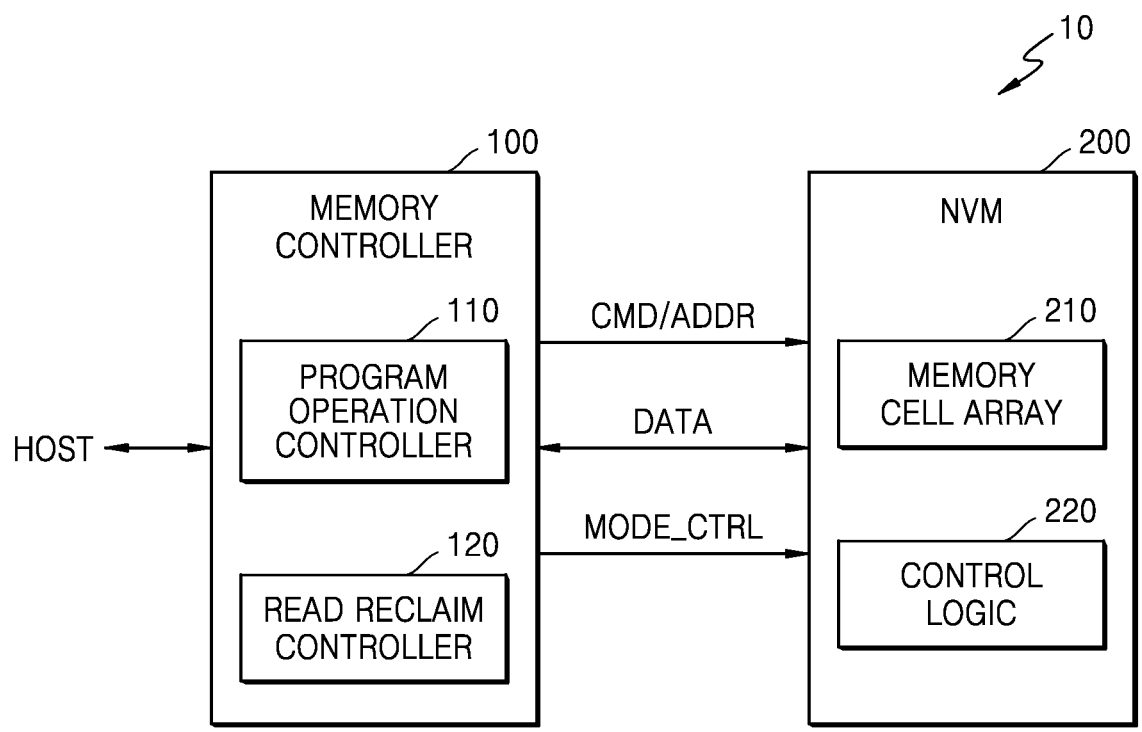
FIG. 1 is a block diagram of a memory system according to an embodiment.

FIG. 1 is a block diagram of a memory system according to an embodiment. Referring to FIG. 1, a memory system 10 may include a memory controller 100 and a non-volatile memory (NVM) 200. In an embodiment, the NVM 200 may include a memory chip, and the memory system 10 may include a plurality of memory chips or a plurality NVMs 200. In an embodiment, the memory controller 100 may be connected to the memory chips respectively through a plurality of channels. For example, the memory system 10 may implemented as a storage device such as a solid state drive (SSD).

The memory controller 100 may control the NVM 200 to program data thereto or read data stored therein in response to a write or read request from a host. In detail, the memory controller 100 may control a program operation, a read operation, and an erase operation on the NVM 200 by providing a command CMD and an address ADDR to the NVM 200. Data DATA to be programmed and data DATA that has been read may be exchanged between the memory controller 100 and the NVM 200. In an embodiment, the command CMD and the address ADDR may be transmitted from the memory controller 100 to the NVM 200 through a same input/output channel as the data DATA. In an embodiment, the command CMD and the address ADDR may be transmitted from the memory controller 100 to the NVM 200 through a first input/output channel, and the data DATA may be transmitted from the memory controller 100 to the NVM 200 through a second input/output channel. The memory controller 100 may further provide a mode control signal MODE_CTRL to the NVM 200. The mode control signal MODE_CTRL may indicate a program mode. The program mode may be predefined according to the number of bits to be stored in a memory cell, according to an embodiment.

The NVM 200 may include a memory cell array 210 and a control logic 220. The memory cell array 210 may include a plurality of memory cells. For example, the memory cells may include flash memory cells. Hereinafter, descriptions will be focused on embodiments in which the memory cells include NAND flash memory cells. However, embodiments are not limited thereto, and the memory cells may include resistive memory cells such as resistive random access memory (ReRAM) cells, phase-change RAM (PRAM) cells, or magnetic RAM (MRAM) cells. The memory cell array 210 may include a plurality of blocks. Each of the blocks may include a plurality of pages. Each of the pages may include a plurality of memory cells. In the memory cell array 210, a data erase operation may be performed in units of blocks, and a data write operation and a data read operation may be performed in units of pages.

The control logic 220 may generally control operations of the NVM 200 in relation with a memory operation. The control logic 220 may output various control signals for programming data to the memory cell array 210, reading data from the memory cell array 210, or erasing data from the memory cell array 210, based on the command CMD and the address ADDR, which are received from the memory controller 100. In an embodiment, the control logic 220 may output a control signal for programming normal data or dummy data to the memory cell array 210 in a program mode corresponding to the mode control signal MODE_CTRL.

According to an embodiment, the memory controller 100 may include a program operation controller 110. The program operation controller 110 may control the NVM 200 such that normal data or dummy data is programmed to the memory cell array 210. In an example, normal data may include data received from a host or meaningful data, and dummy data may include random data or meaningless data. The program operation controller 110 may determine a program mode for normal data or dummy data and provide the NVM 200 with the mode control signal MODE_CTRL corresponding to the determined program mode. The control logic 220 may program normal data or dummy data based on the mode control signal MODE_CTRL. A program mode may be predefined according to the number of data bits to be stored in a memory cell. For example, the program mode may include a quadruple-level cell (QLC) mode in which four bits of data are to be stored in a memory cell, a triple-level cell (TLC) mode in which three bits of data are to be stored in a memory cell, a multi-level cell (MLC) mode in which two bits of data are to be stored in a memory cell, or a single-level cell (SLC) mode in which one bit of data are to be stored in a memory cell. When the number of data bits to be stored in a memory cell decreases, a time taken for data to be programmed to the NVM 200 may decrease. Accordingly, data may be programmed faster in the SLC mode than in other program modes. As the number of data bits stored in a memory cell decreases, a valley margin between threshold voltage distributions may increase. The program mode will be described below with reference to FIGS. 6A through 6D.

Figure 3:
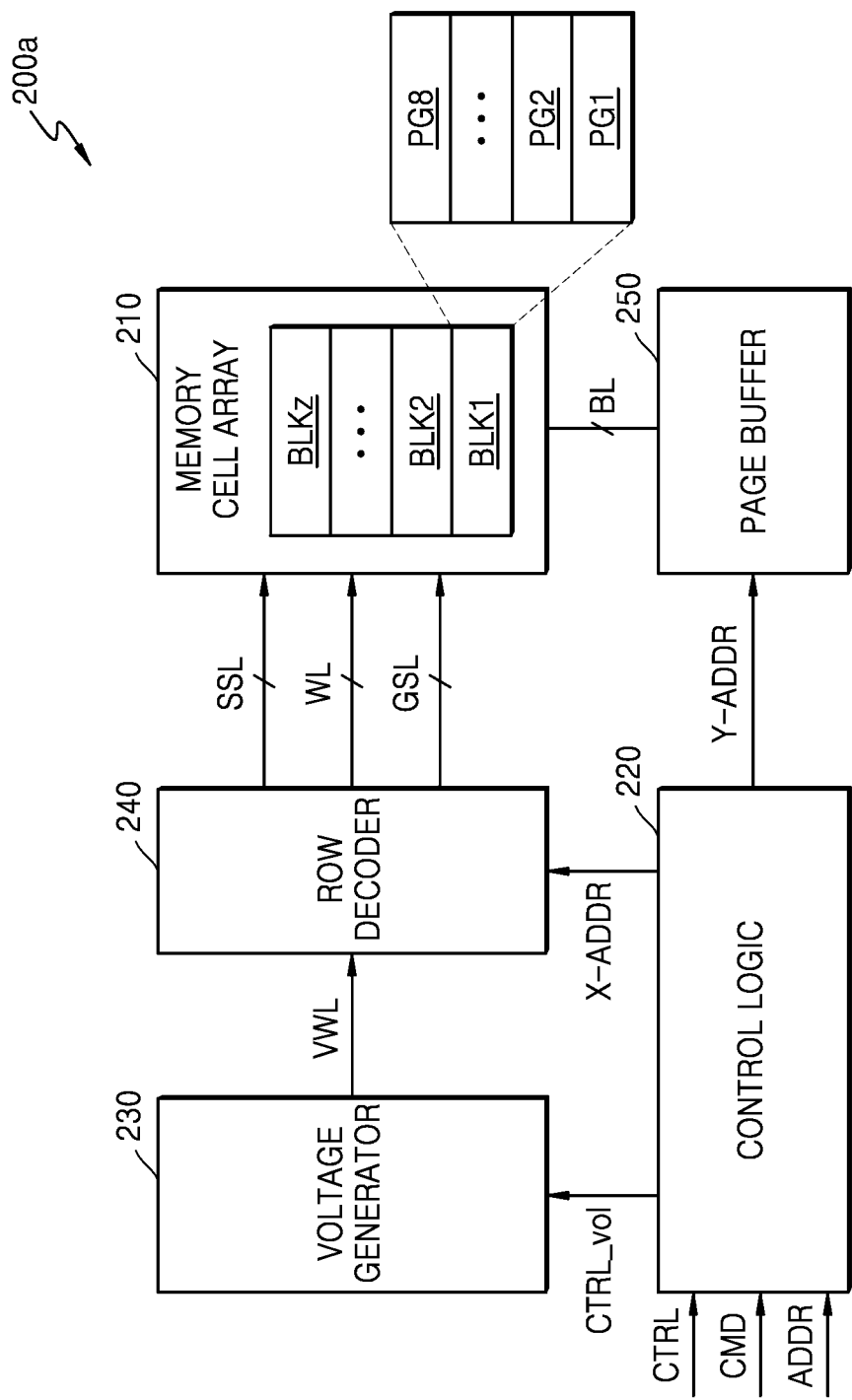
FIG. 3 is a block diagram of an example implementation of a non-volatile memory in FIG. 1.

The program operation controller 110 may control the NVM 200 such that normal data is programmed to some pages of a first memory block in a first program mode. As shown in FIG. 3, the memory cell array 210 may include a plurality of memory blocks (e.g., first through z-th memory blocks BLK1 through BLKz), and each memory block may include a plurality of pages (e.g., first through eighth pages PG1 through PG8). The first program mode may refer to a program mode, in which at least two bits of data are stored in a memory cell. For example, the first program mode may include the MLC mode, the TLC mode, or the QLC mode.

The program operation controller 110 may control the NVM 200 such that dummy data is programmed to the other pages of the first memory block, to which the normal data has not been programmed. When an erase program interval (EPI), i.e., a time period until a program operation is performed on a memory block after an erase operation is performed on the memory block, is long, threshold voltage distribution characteristics of the memory block may be degraded. Accordingly, when dummy data is programmed to an unprogrammed page among the pages of a memory block having a relatively long EPI, normal data may be prevented from being programmed to the unprogrammed page. A threshold voltage distribution with respect to an EPI will be described below with reference to FIG. 2.

The program operation controller 110 may control the NVM 200 such that dummy data is programmed to the other pages of the first memory block in multiple program modes including the first program mode.

In detail, the program operation controller 110 may control the NVM 200 such that dummy data is programmed to a page connected to a weak word line in the first program mode, and dummy data is programmed to a page connected to a normal word line in at least one second program mode, in which fewer bits of data are stored in a memory cell than in the first program mode. A weak word line refers to a word line, for which a read error is relatively highly likely to be determined. For example, dummy data may be programmed in the MLC mode to a page connected to a weak word line, and dummy data may be programmed in the SLC mode to a page connected to a normal word line. According to an embodiment, the memory system 10 may increase dummy data storing speed by programming the dummy data in the SLC mode. A weak word line may include a word line connected to memory cells having poor retention or disturbance characteristics. In other words, a weak word line may include a word line connected to memory cells, of which the threshold voltage distribution is relatively rapidly shifted by retention or disturbance. A weak word line may be described with reference to FIGS. 9 and 10.

According to an embodiment, the memory controller 100 may include a read reclaim controller 120. The read reclaim controller 120 may monitor a weak word line, and copy normal data programmed to the first memory block to a second memory block. In detail, the read reclaim controller 120 may monitor a weak word line by reading a page connected to the weak word line in the first memory block and counting fail bits. When the number of counted fail bits is greater than a reference number, the read reclaim controller 120 may copy normal data, which has been programmed to the first memory block, to the second memory block.

In a case where dummy data is stored in the SLC mode in a page connected to a weak word line, even when a threshold voltage distribution is shifted, a likelihood of occurrence of a fail bit may be relatively low because there is a wide gap between threshold voltage distributions in the SLC mode. Accordingly, even though a time for a read reclaim has passed when the number of fail bits of normal data is greater than or equal to a reference number, the number of fail bits of dummy data corresponding to the weak word line may be less than the reference number. Consequently, it may not be appropriate to determine a read reclaim time of normal data by monitoring a weak word line programmed in the SLC mode. Therefore, according to an embodiment, the memory system 10 may increase the accuracy of a read reclaim by programming dummy data to a page connected to a weak word line in the same program mode as normal data. This will be described in detail with reference to FIGS. 5A through 5C.

The memory system 10 may include an internal memory embedded in an electronic device. For example, the memory system 10 may include an SSD, an embedded universal flash storage (UFS) memory device, or an embedded multi-media card (eMMC). In some embodiments, the memory system 10 may include an external memory that may be removed from an electronic device. For example, the memory system 10 may include a UFS memory card, a compact flash (CF) card, a secure digital (SD) card, a micro-SD card, a mini-SD card, an extreme digital (xD) card, or a memory stick.

The memory system 10 and a host may form a storage system. The storage system may include, for example, a personal computer (PC), a data server, network-attached storage (NAS), an Internet of things (IoT) device, or a portable electronic device. The portable electronic device may include a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

Figure 2:
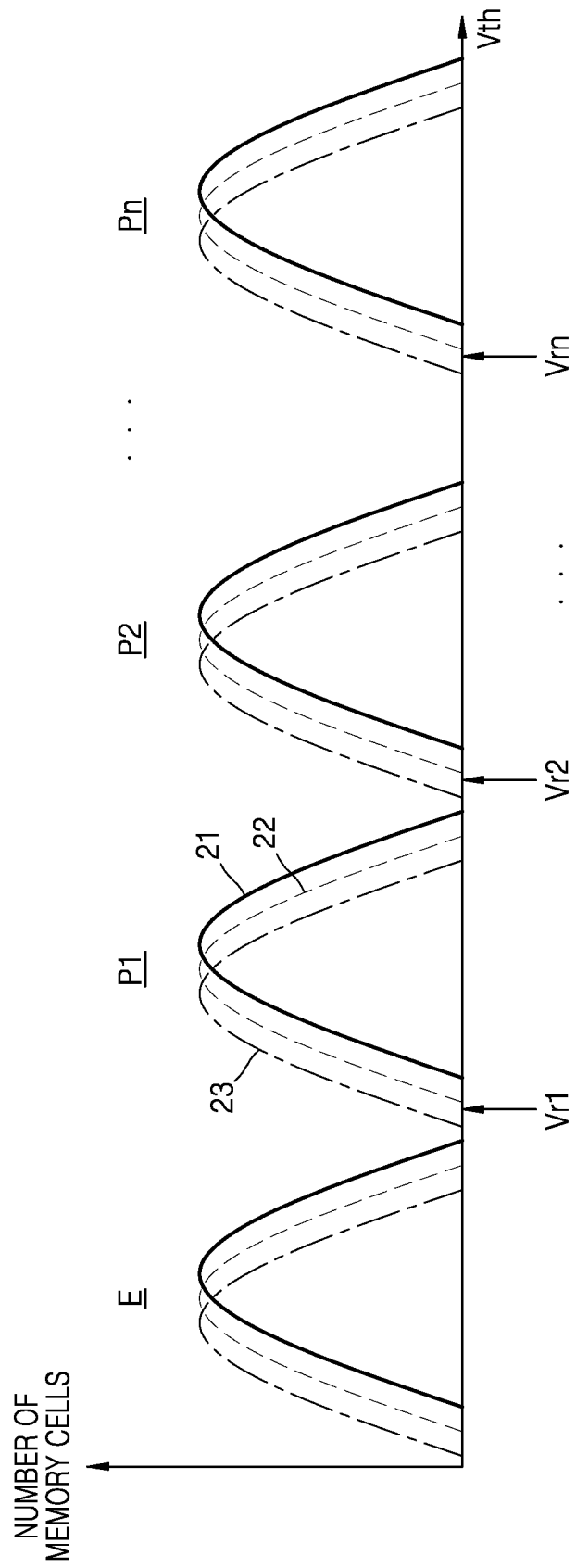
FIG. 2 shows threshold voltage distributions shifting with respect to an erase program interval (EPI)

FIG. 2 shows threshold voltage distributions shifting with respect to an EPI. In a flash memory device, an EPI indicating a time period between a time when an erase operation is performed on a memory block and a time when a program operation is performed on the memory block. Due to the characteristics of a flash memory device, and particularly, vertical NAND (VNAND) flash memory including a block having a three-dimensional (3D) structure, when an EPI increases, reliability of data may be degraded. For example, hole spreading may occur in a space between adjacent memory cells during a time period until a program operation is performed since an erase operation is performed, and when data is programmed with a relatively long EPI, electrons may recombine with holes after the program operation is performed. Accordingly, a threshold voltage distribution of memory cells may be shifted.

Referring to FIG. 2, the horizontal axis is a threshold voltage and the vertical axis is the number of memory cells. In a first case 21 where a program operation is performed on a block right after an erase operation is performed on the block, that is, in a case where an EPI is 0, memory cells may be in one of an erased state E and first through n-th programmed states P1 through Pn according to a threshold voltage. For example, respective read voltage levels for the first and second programmed states P1 and P2 may be predefined as Vr1 and Vr2.

In a second case 22 where a program operation is performed on a memory block a first time after an erase operation is performed on the memory block, that is, in a case where an EPI is relatively short, a threshold voltage distribution may be generally shifted to the left (or in a direction in which a threshold voltage level decreases), compared to the first case 21. In a third case 23 where a program operation is performed on a memory block a second time after an erase operation is performed on the memory block, the second time longer than the first time, that is, in a case where an EPI is relatively long, a threshold voltage distribution may be generally shifted further to the left (or in a direction in which a threshold voltage level decreases), compared to the second case 22.

As described above, when data is programmed with a relatively long EPI, threshold voltage distribution characteristics may be degraded compared to when data is programmed with a relatively short EPI. When a read operation is performed on memory cells using predefined read voltage levels Vr1, Vr2, . . . , and Vrn in this state, a read error may occur, and accordingly, reliability of data stored in the memory cells may be degraded. Therefore, according to an embodiment, the memory system 10 may prevent normal data from being programmed to a memory block having a relatively long EPI by programming dummy data to the memory block.

In addition, the memory system 10 may increase dummy data storing speed by programming dummy data to a page connected to a normal word line in the SLC mode, and may increase read reclaim performance by programming dummy data to a page connected to a weak word line in the same program mode as normal data.

FIG. 3 is a block diagram of an example implementation of the NVM 200 in FIG. 1. A suffix of a reference numeral (e.g., "a" in 200a) is used for distinguishing from each other circuits having the same functions.

Referring to FIGS. 1 and 3, a memory device 200a may include the memory cell array 210, the control logic 220, a voltage generator 230, a row decoder 240, and a page buffer 250. Although not shown in FIG. 3, the memory device 200a may further include various elements, such as a data input/output circuit and an input/output interface, which are related to memory operations.

The memory cell array 210 may include a plurality of memory blocks, e.g., the first through z-th memory blocks BLK1 through BLKz, and memory cells of the first through z-th memory blocks BLK1 through BLKz may be connected to word lines WL, string selection lines SSL, ground selection lines GSL, and bit lines BL. The memory cell array 210 may be connected to the row decoder 240 through the word lines WL, the string selection lines SSL, and the ground selection lines GSL and connected to the page buffer 250 through the bit lines BL. Each memory cell may store one or more bits. For example, each memory cell may correspond to an MLC, a TLC, or a QLC. Each memory block may include a plurality of pages, e.g., the first through eighth pages PG1 through PG8, each of which may be connected to a word line WL.

In an embodiment, the memory cell array 210 may include a two-dimensional (2D) memory cell array, which may include a plurality of cell strings in row and column directions. According to an embodiment, the memory cell array 210 may be a 3D memory cell array, which may include a plurality of cell strings. Each cell string may include memory cells respectively connected to word lines, which are vertically stacked on a substrate. Structures of a 3D memory cell array, in which the 3D memory cell array includes a plurality of levels and word lines and/or bit lines are shared by levels, are disclosed in U.S. Pat. Nos. 7,679,133, 8,553,466, 8,654,587, 8,559,235, and U.S. Patent Publication No. 2011/0233648, the disclosures of which are incorporated herein in their entirety by reference.

The control logic 220 may output various kinds of internal control signals for programming data to the memory cell array 210 or reading data from the memory cell array 210, based on the command CMD, the address ADDR, and a control signal CTRL, which are received from the memory controller 100. For example, the control logic 220 may output a voltage control signal CTRL_vol for controlling the levels of various voltages generated by the voltage generator 230, and may provide a row address X-ADDR to the row decoder 240 and a column address Y-ADDR to the page buffer 250. The control signal CTRL may include the mode control signal MODE_CTRL in FIG. 1. Accordingly, the control logic 220 may output an internal control signal for programming normal data or dummy data in a program mode corresponding to the mode control signal MODE_CTRL.

The voltage generator 230 may generate various kinds of voltages for performing program, read, and erase operations on the memory cell array 210, based on the voltage control signal CTRL_vol. In detail, the voltage generator 230 may generate a word line voltage VWL, e.g., a program voltage, a read voltage, or a program verify voltage. The row decoder 240 may select one of a plurality of word lines WL and one of the string selection lines SSL in response to the row address X-ADDR. The page buffer 250 may select some of the bit lines BL in response to the column address Y-ADDR. In detail, the page buffer 250 operates as a write driver or a sense amplifier according to an operation mode.

In an embodiment, the control signal CTRL may include the mode control signal MODE_CTRL. The mode control signal MODE_CTRL may include information about a program mode. The control logic 220 may generate the voltage control signal CTRL_vol according to a program mode to allow a program operation to be performed. For example, when the program mode is an MLC mode, the control logic 220 may generate the voltage control signal CTRL_vol for generating a program voltage and a program verify voltage such that a memory cell is programmed to be in one of first through third programmed states P1 through P3, as shown in FIG. 6B. For example, when the program mode is a TLC mode, the control logic 220 may generate the voltage control signal CTRL_vol for generating a program voltage and a program verify voltage such that a memory cell is programmed to be in one of first through seventh programmed states P1 through P7, as shown in FIG. 6C. For example, when the program mode is a QLC mode, the control logic 220 may generate the voltage control signal CTRL_vol for generating a program voltage and a program verify voltage such that a memory cell is programmed to be in one of first through fifteenth programmed states P1 through P15, as shown in FIG. 6D.

Figure 4:
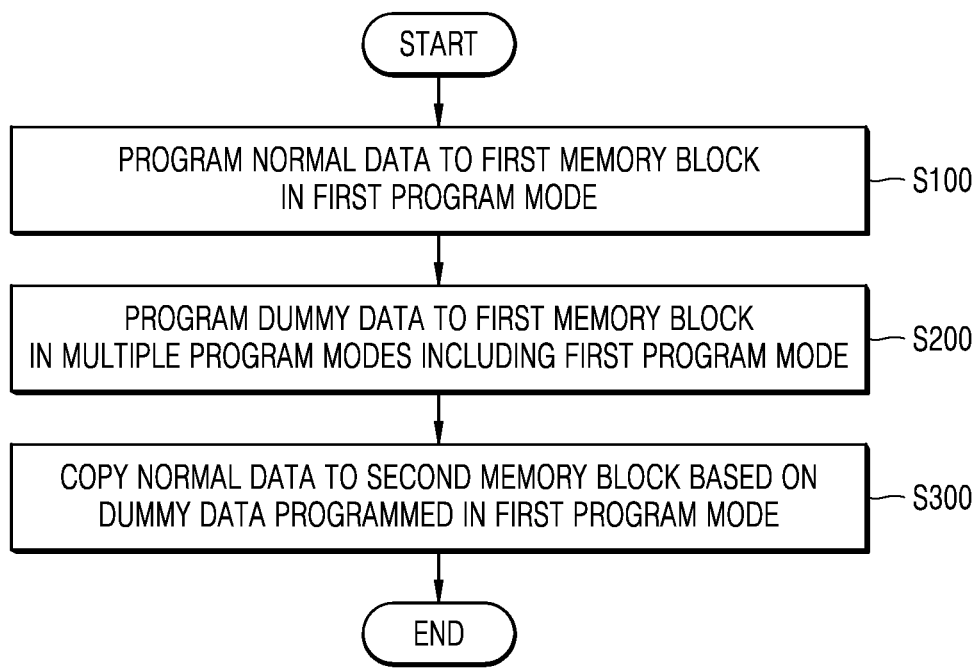
FIG. 4 is a flowchart of an operating method of a memory system, according to an embodiment.

FIG. 4 is a flowchart of an operating method of a memory system, according to an embodiment. Referring to FIG. 4, the operating method of a memory system may include a plurality of operations S100, S200, and S300.

The memory system 10 may program normal data to the first memory block in the first program mode in operation S100. In the first program mode, at least two bits may be stored in one memory cell. For example, the first program mode may correspond to the MLC mode, the TLC mode, or the QLC mode.

The memory system 10 may program dummy data to the first memory block in multiple program modes including the first program mode in operation S200.

In detail, the memory system 10 may program dummy data to memory cells, which are connected to a weak word line, in the first program mode. When dummy data is programmed to the memory cells connected to a weak word line in the first program mode, read reclaim performance in operation S300 may be increased. This may be described in detail with reference to FIG. 5B.

The memory system 10 may program dummy data to memory cells, which are connected to a normal word line, in the second program mode that is different from the first program mode. A smaller number of bits may be stored in one memory cell in the second program mode than in the first program mode. For example, the second program mode may correspond to the SLC mode. When dummy data is programmed to the memory cells connected to a normal word line in the second program mode, high program speed may be provided for the dummy data. In an embodiment, the memory system 10 may program dummy data to memory cells, which are connected to a boundary word line, in the first program mode. A boundary word line refers to a word line that separates a region storing normal data from a region storing dummy data. When dummy data is programmed to the memory cell connected to a boundary word line in the first program mode, the reliability of normal data may be increased. This may be described in detail with reference to FIG. 5C.

The memory system 10 may perform a read reclaim operation, in which the normal data is copied to the second memory block, based on the dummy data programmed in the first program mode, i.e., the dummy data programmed to the memory cells connected to a weak word line, in operation S300. In detail, the dummy data, which has been programmed to the memory cells connected to a weak word line, may be read, and the read reclaim operation may be performed on the normal data when the number of fail bits in the read dummy data is greater than a reference number. The dummy data that has been programmed to the memory cells, which are connected to a weak word line, in the same program mode as the normal data may be more vulnerable to retention or disturbance than the normal data. Accordingly, when the read reclaim operation is performed based on the dummy data programmed to a weak page before the number of fail bits in the normal data increases excessively, reliability of the normal data may be increased.

Figure 5A:
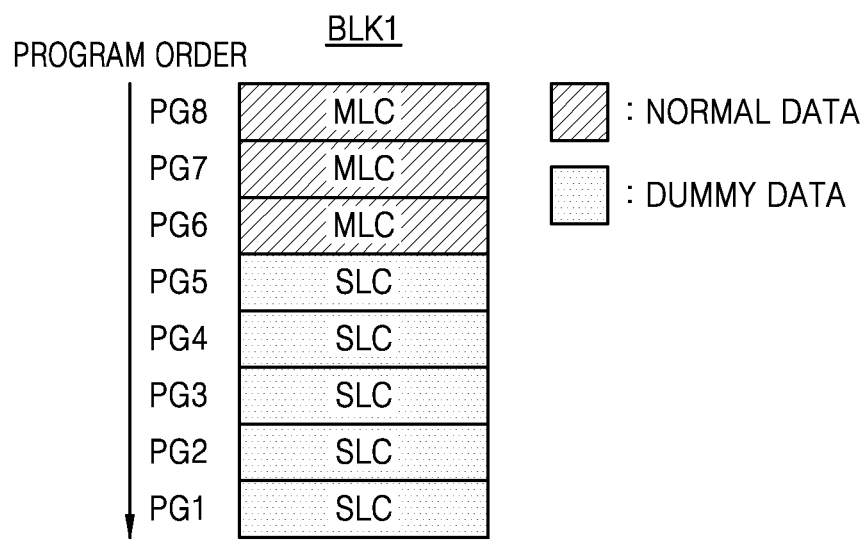
FIGS. 5A through 5C are diagrams for describing a program method according to an embodiment.
Figure 5B:
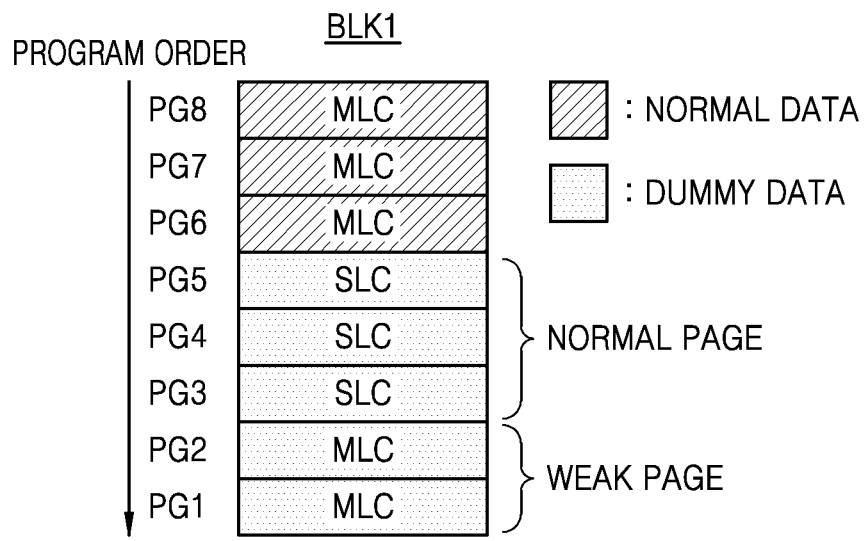
Figure 5C:
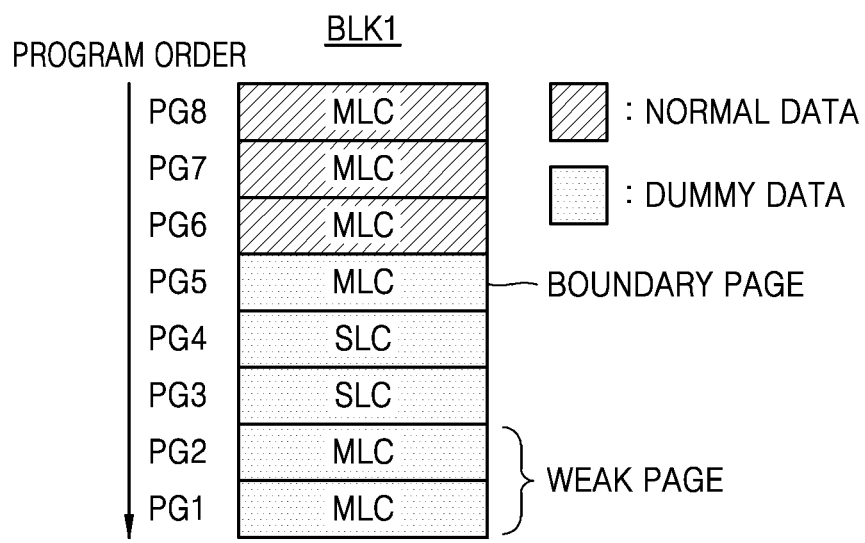

FIGS. 5A through 5C are diagrams for describing a program method according to an embodiment. In FIGS. 5A through 5C, the first memory block BLK1 may include the first through eighth pages PG1 through PG8. The number of pages included in a memory block is not limited thereto. In FIGS. 5A through 5C, it is assumed that the eighth to the first pages PG8 to PG1 sequentially undergo a program operation.

Referring to FIG. 5A, normal data may be programmed sequentially to the eighth page PG8 through the sixth page PG6. The normal data may be programmed to the eighth page PG8 through the sixth page PG6 in the MLC mode or another program mode, such as the TLC mode or the QLC mode, in which at least two bits are stored in a memory cell.

As described above with reference to FIG. 2, dummy data may be programmed to the other pages, i.e., the first through fifth pages PG1 through PG5, of the first memory block BLK1 to increase read reclaim performance. The dummy data is meaningless data or random data, and thus may be stored in the SLC mode for fast programming. However, embodiments are not limited thereto. Normal data may be programmed in a program mode, such as the TLC mode or the QLC mode, in which at least two bits are stored in a memory cell, and dummy data may be programmed in at least one program mode, in which a smaller number of bits are stored in a memory cell than in the program mode for storing the normal data.

Referring to FIG. 5B, dummy data may be programmed in multiple program modes. In detail, the dummy data may be programmed to weak pages, e.g., the first and second pages PG1 and PG2, in the MLC mode as the normal data, and programmed to normal pages, e.g., the third through fifth pages PG3, PG4, and PG5, in the SLC mode, in which a smaller number of bits are stored in a memory cell than in the MLC mode, to increase a program speed. The weak pages, e.g., the first and second pages PG1 and PG2, may include memory cells connected to a weak word line. The normal pages, e.g., the third through fifth pages PG3, PG4, and PG5, may include memory cells connected to not a weak line but a normal word line. However, embodiments are not limited thereto. When normal data is programmed in the TLC mode, dummy data may be programmed to weak pages, e.g., the first and second pages PG1 and PG2, in the TLC mode, and programmed to normal pages, e.g., the third through fifth pages PG3, PG4, and PG5, in the SLC mode or the MLC mode.

Referring to FIG. 5C, dummy data may be programmed in multiple program modes. In detail, the dummy data may be programmed to weak pages, e.g., the first and second pages PG1 and PG2, and a boundary page, e.g., the fifth page PG5, in the same program mode, e.g., the MLC mode, as the normal data. The boundary page may be adjacent to a page to which the normal data has been programmed. The boundary page may include memory cells connected to a boundary word line. The boundary word line may be adjacent to a word line connected to the page to which the normal data has been programmed. However, embodiments are not limited thereto. The boundary page may include a plurality of pages adjacent to a page to which normal data has been programmed. In other words, although the fifth page PG5 is shown as the boundary page in FIG. 5C, the fourth page PG4 may also be the boundary page. Because the level of a voltage applied to a word line is different according to a program mode, a threshold voltage distribution of a page, to which normal data has been programmed, may be influenced by a program operation on a boundary page when a program mode for the boundary page is different from a program mode, in which the normal data has been programmed.

According to an embodiment, data reliability of a page to which normal data has been programmed may be increased by programming a boundary page in a program mode in which the normal data has been programmed to the page.

FIGS. 6A through 6D illustrate threshold voltage distributions of memory cells programmed in the SLC mode, the MLC mode, the TLC mode, and the QLC mode, respectively. In FIGS. 6A through 6D, the horizontal axis is a threshold voltage and the vertical axis is the number of memory cells.

Figure 6A:
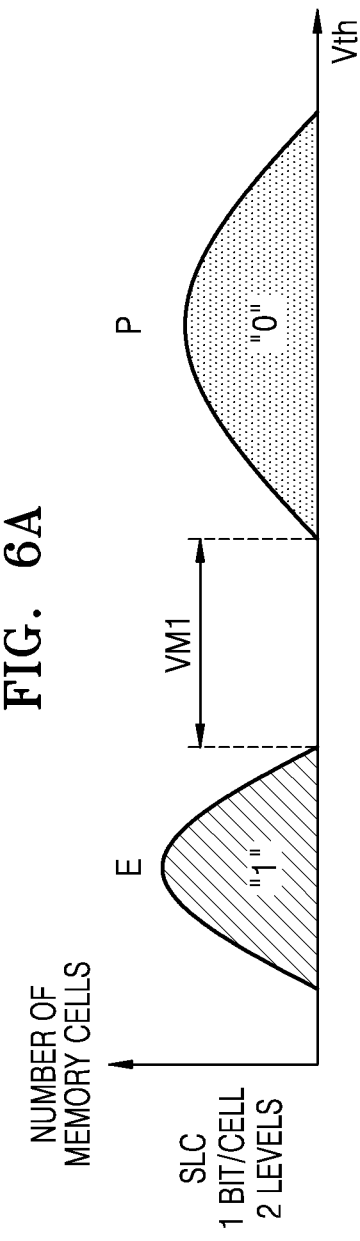
FIGS. 6A through 6D illustrate threshold voltage distributions of memory cells programmed in a single-level cell (SLC) mode, a multi-level cell (MLC) mode, a triple-level cell (TLC) mode, and a quadruple-level cell (QLC) mode, respectively.
Figure 6B:
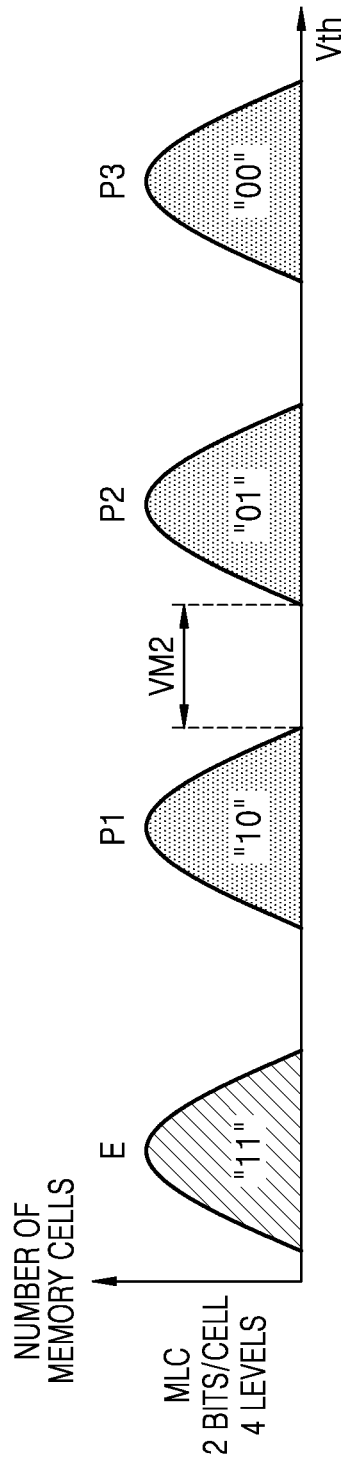
Figure 6C:
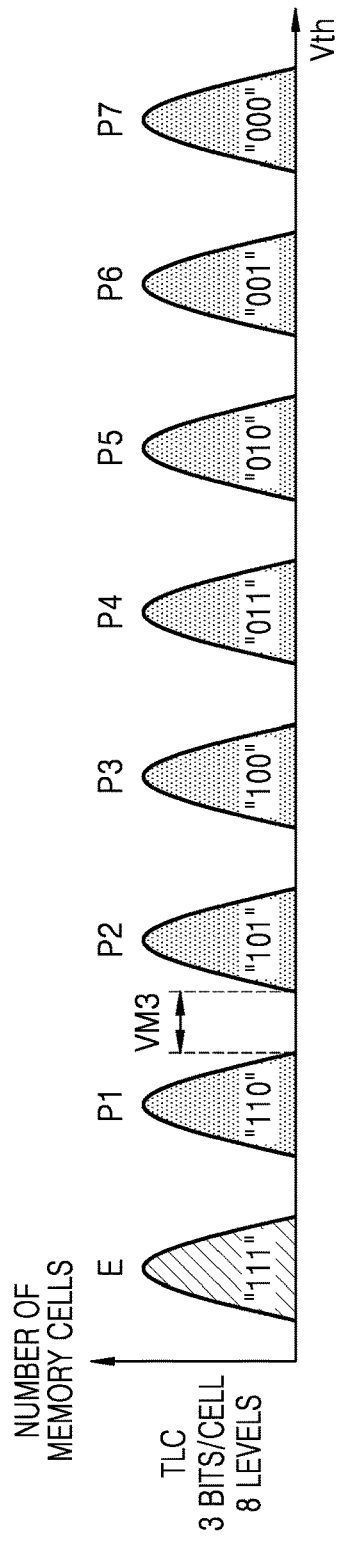
Figure 6D:
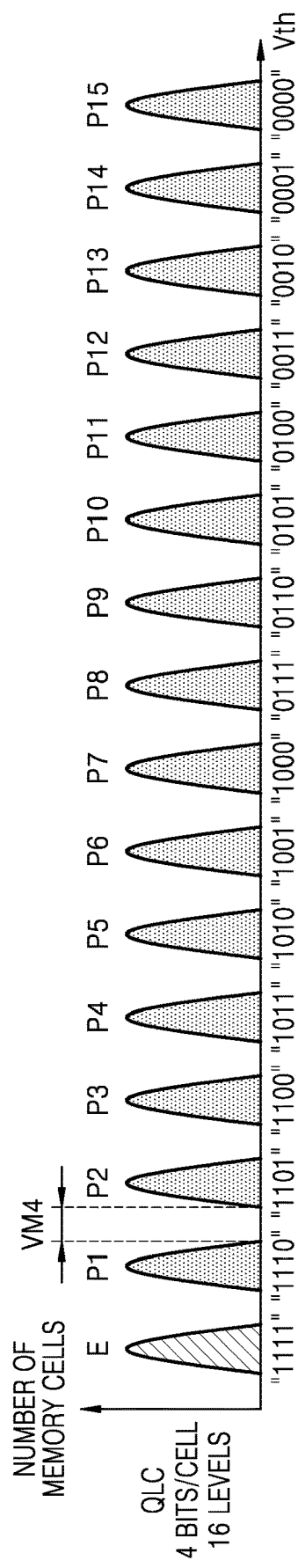

Referring to FIG. 6A, the SLC mode is a program mode in which 1-bit data is stored in a memory cell. The memory cell may be programmed in the SLC mode so as to be in one of two states according to a threshold voltage distribution. For example, a memory cell storing data "1" may be in the erased state E, and a memory cell storing data "0" may be in a programmed state P.

Referring to FIG. 6B, the MLC mode is a program mode in which 2-bit data is stored in a memory cell. The memory cell may be programmed in the MLC mode so as to be in one of four states according to a threshold voltage distribution. For example, a memory cell storing data "11" may be in the erased state E, and memory cells respectively storing data "10", "01", and "00" may be respectively in first through third programmed states P1 through P3.

Referring to FIG. 6C, the TLC mode is a program mode in which 3-bit data is stored in a memory cell. The memory cell may be programmed in the TLC mode so as to be in one of eight states according to a threshold voltage distribution. For example, a memory cell storing data "111" may be in the erased state E, and memory cells respectively storing data "110", "101", "100", "011", "010", "001", and "000" may be respectively in first through seventh programmed states P1 through P7.

Referring to FIG. 6D, the QLC mode is a program mode in which 4-bit data is stored in a memory cell. The memory cell may be programmed in the QLC mode so as to be in one of sixteen states according to a threshold voltage distribution. For example, a memory cell storing data "1111" may be in the erased state E, and memory cells respectively storing data "1110", "1101", "1100", "1011", "1010", "1001", "1000", "0111", "0110", "0101", "0100", "0011", "0010", "0001", and "0000" may be respectively in first through fifteenth programmed states P1 through P15.

Referring to FIGS. 6A through 6D, a gap between two adjacent states, i.e., two valleys, may be defined as a valley margin. In the case of cells programmed in the SLC mode, there may be a first valley margin VM1 between the erased state E and the programmed state P. In the case of cells programmed in the MLC mode, there may be a second valley margin VM2 between the first and second programmed states P1 and P2, wherein the second valley margin VM2 is smaller than the first valley margin VM1. In the case of cells programmed in the TLC mode, there may be a third valley margin VM3 between the first and second programmed states P1 and P2, wherein the third valley margin VM3 is smaller than the second valley margin VM2. In the case of cells programmed in the QLC mode, there may be a fourth valley margin VM4 between the first and second programmed states P1 and P2, wherein the fourth valley margin VM4 is smaller than the third valley margin VM3. As described above, a valley margin decreases as the program mode changes from the SLC mode to the MLC mode, TLC mode, and the QLC mode.

Because the SLC mode has the largest valley margin, when a weak page is programmed in the SLC mode, a probability of a read error in the weak page may be low despite a distribution shift caused by retention or disturbance.

A read reclaim operation may have to be performed before a read error occurs in a page storing normal data. However, because a weak page programmed in the SLC mode has a low read error probability due to a relatively large valley margin, a read error may occur later in the weak page than in a page, to which normal data has been programmed in the MLC mode. Accordingly, when a read reclaim operation is performed based on a result of monitoring a weak page programmed in the SLC mode, read reclaim performance may be decreased. Therefore, according to an embodiment, the memory system 10 may increase read reclaim performance by programming dummy data to a weak page in a program mode in which normal data is programmed.

Figure 7A:
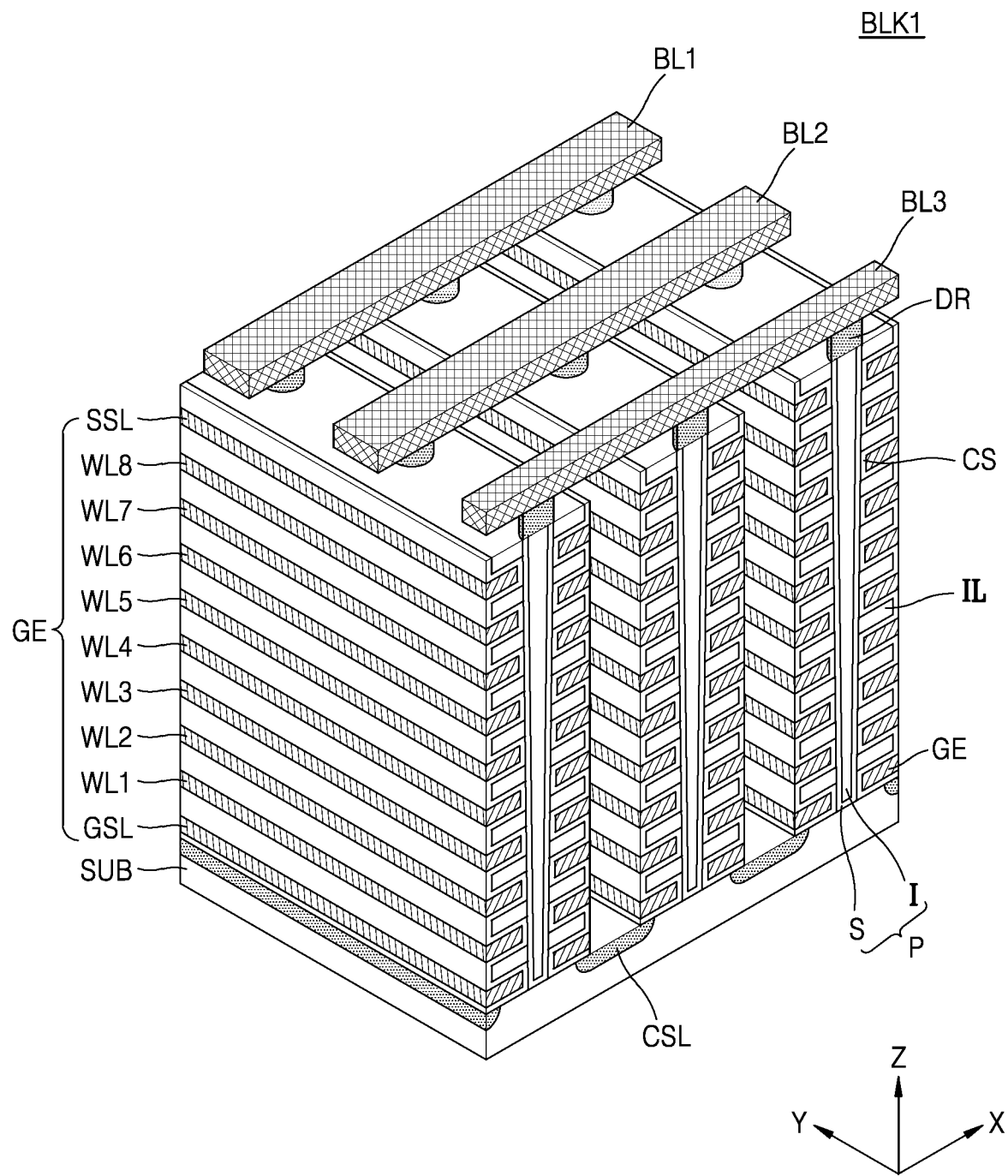
FIG. 7A is a perspective view of a memory block in FIG. 3.
Figure 7B:
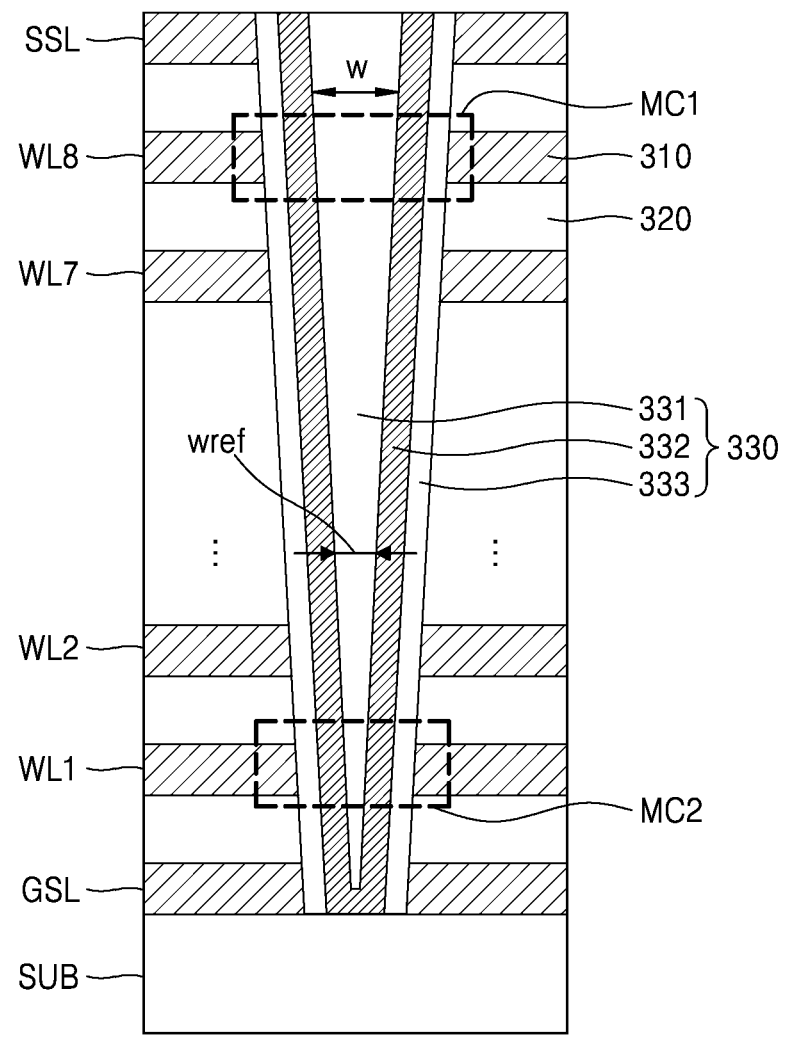
FIG. 7B is a partial cross-sectional view of the memory block in FIG. 3.

FIG. 7A is a perspective view of the first memory block BLK1 in FIG. 3. FIG. 7B is a partial cross-sectional view of the first memory block BLK1 in FIG. 3

Referring to FIG. 7A, each memory block included in a memory cell array (e.g., the memory cell array 110 in FIG. 1) is formed in a direction perpendicular to a substrate SUB. Herein, an X direction may be referred to as a first direction, a Y direction may be referred to as a second direction, and a Z direction may be referred to as a vertical direction or a third direction. Although it is illustrated in FIG. 7A that the first memory block BLK1 includes two selection lines, i.e., a ground selection line GSL and a string selection line SSL, eight word lines, i.e., first through eighth word lines WL1 through WL8, and three bit lines BL1 through BL3, there may be more lines or less lines.

The substrate SUB has a first conductivity type (e.g., a p-type). A common source line CSL extends in the substrate SUB in the second direction, and is doped with impurities of a second conductivity type (e.g., an n-type). On a region of the substrate SUB between two adjacent common source lines CSL, a plurality of insulating layers IL extend in the first direction, and are sequentially provided in the third direction. The insulating layers IL are separated from each other by a certain distance in the third direction. For example, the insulating layers IL may include an insulating material such as silicon oxide.

On the region of the substrate SUB between two adjacent common source lines CSL, a plurality of pillars P pass through the insulating layers IL in the third direction. The plurality of pillars P are arranged in the first direction. For example, the pillars P pass through the insulating layers IL to be in contact with the substrate SUB. In detail, a surface layer S of each pillar P may include a silicon material of the first conductivity type and may function as a channel region. An inner layer I of each pillar P may include an insulating material such as silicon oxide or an air gap.

In a region between two adjacent common source lines CSL, a charge storage layer CS is provided along exposed surfaces of the insulating layers IL, the pillars P, and the substrate SUB. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. In the region between two adjacent common source lines CSL, gate electrodes GE, such as the ground selection line GSL, the string selection line SSL, and the first through eighth word lines WL1 through WL8, are provided on an exposed surface of the charge storage layer CS.

Drains or drain contacts DR are respectively provided on the pillars P. For example, the drains or drain contacts DR may include a silicone material doped with impurities of the second conductivity type. The bit lines BL1 through BL3 extend on the drains DR in the first direction and are separated from each other by a certain distance in the second direction.

Referring to FIG. 7B, the first memory block BLK1 having a 3D structure may include gate electrodes 310 corresponding to the gate electrodes GE and insulating layers 320 corresponding to the insulating layers IL. The gate electrodes 310 and the insulating layer 320 are alternatingly formed in the vertical direction. A channel structure 330 may include a channel 332, a dielectric film structure 333 surrounding an outer side wall of the channel 332, and a channel burying film pattern 331 inside the channel 332. The structure described above is just an example. According to embodiments, a memory block having a 3D structure may have other various structures, on which an etching process is performed at least two times. As shown in FIG. 7B, a width "w" of the channel structure 330 may decrease downwards in the vertical direction. Because the storage of charges becomes unstable as the width "w" decreases, the threshold voltage distribution of a first memory cell MC1 having a relatively wide channel width may be more shifted by retention or disturbance than the threshold voltage distribution of a second memory cell MC2 having a relatively narrow channel width.

Referring to FIG. 7B, a word line connected to a memory cell, in which the width "w" is less than a reference width wref, may be a weak word line. For example, the first and second word lines WL1 and WL2 may be weak word lines.

Referring to FIG. 7B, at least one word line adjacent to the substrate SUB may be a weak word line. For example, the first and second word lines WL1 and WL2 may be weak word lines.

Figure 8:
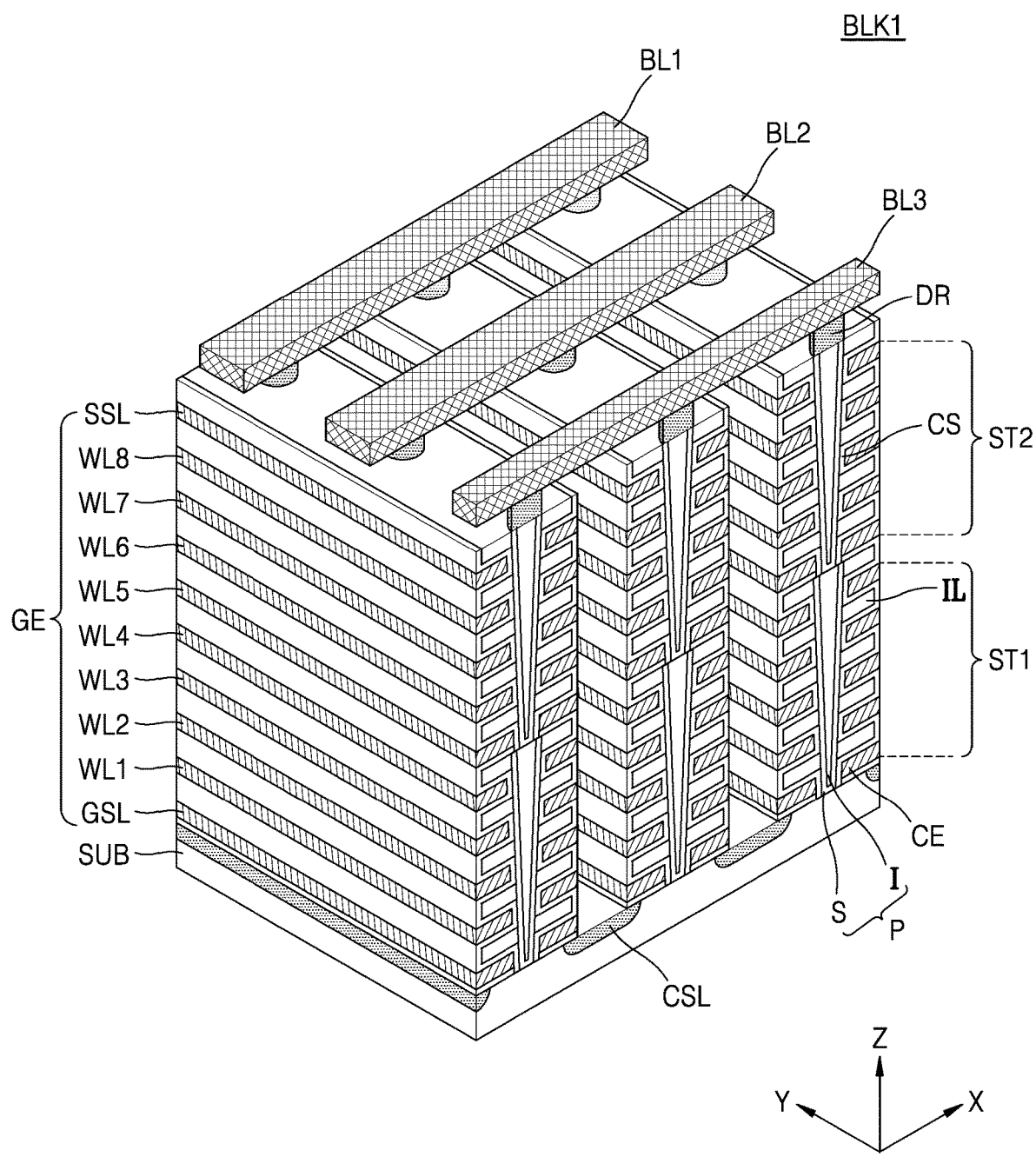
FIG. 8 is a perspective view of a memory block having a double-stack structure, according to an embodiment.

FIG. 8 is a perspective view of the first memory block BLK1 having a double-stack structure, according to an embodiment.

Referring to FIG. 8, the first memory block BLK1 may include a first memory stack ST1 and a second memory stack ST2. As the number of word lines increases, a difference between an upper width and a lower width of a channel may increase. To secure a uniform channel width between the upper and lower portions of a channel, the first memory stack ST1 and the second memory stack ST2 may be formed by separate processes, and the first memory block BLK1 having a double-stack structure may be formed such that the channel of the first memory stack ST1 and the channel of the second memory stack ST2 may be shared with each other.

Even in the case of a double-stack structure, the threshold voltage distribution of a memory cell having a relative narrow channel width may be relatively greatly shifted by retention or disturbance.

Figure 9:
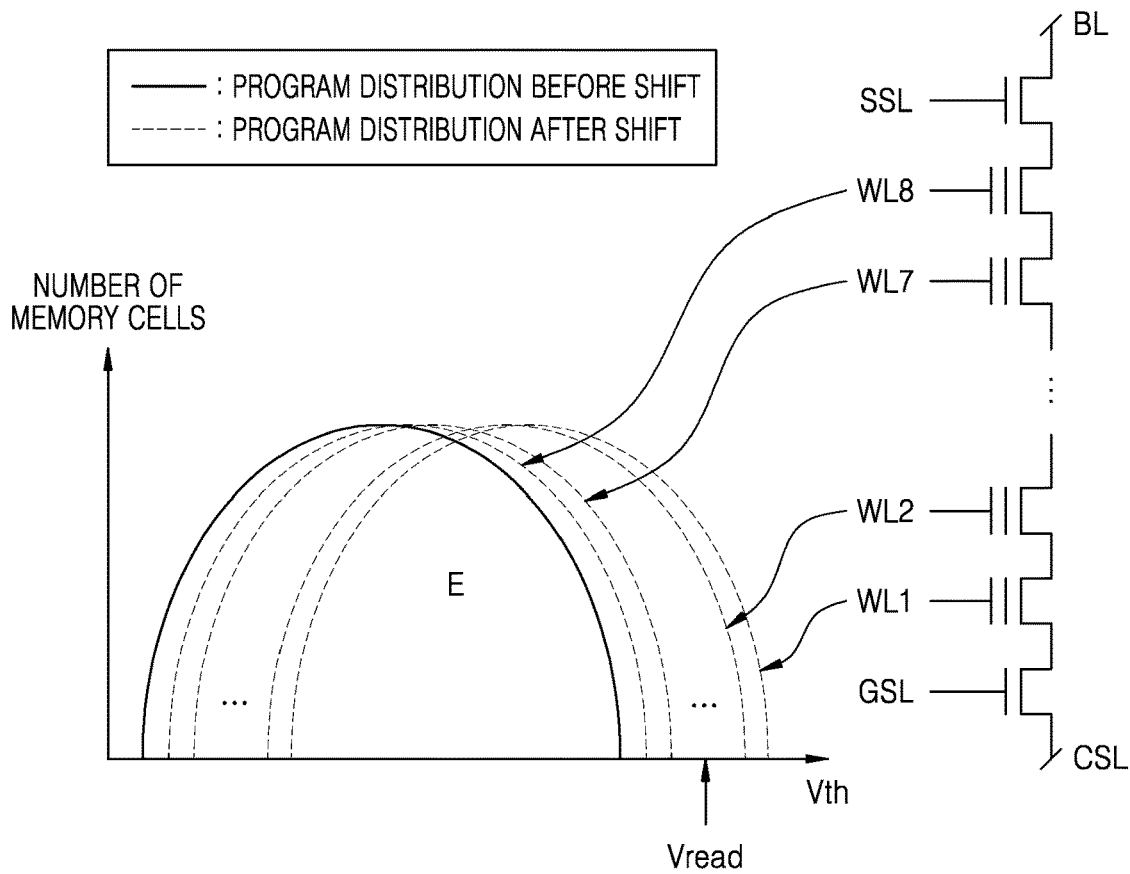
FIG. 9 is a diagram for describing a shift of a threshold voltage distribution, according to an embodiment.

FIG. 9 is a diagram for describing a shift of a threshold voltage distribution, according to an embodiment.

The threshold voltage distribution of memory cells connected to the first through eighth word lines WL1 through WL8 may be shifted by retention or disturbance. According to process characteristics, a shift amount may be different for each memory cell. For example, before the threshold voltage distribution is shifted, the memory cells connected to the first through eighth word lines WL1 through WL8 may have the same threshold voltage distribution. However, because of retention or disturbance, the threshold voltage distribution of memory cells connected to the first word line WL1 may be shifted most, and the threshold voltage distribution of memory cells connected to the eighth word line WL8 may be shifted least. When the shift amount of the threshold voltage distribution increases, the number of fail bits may also increase even if data is read by a predefined read voltage. Because a read error is determined according to the number of fail bits, a read error is highly likely to occur in memory cells connected to the first word line WL1.

Figure 10:
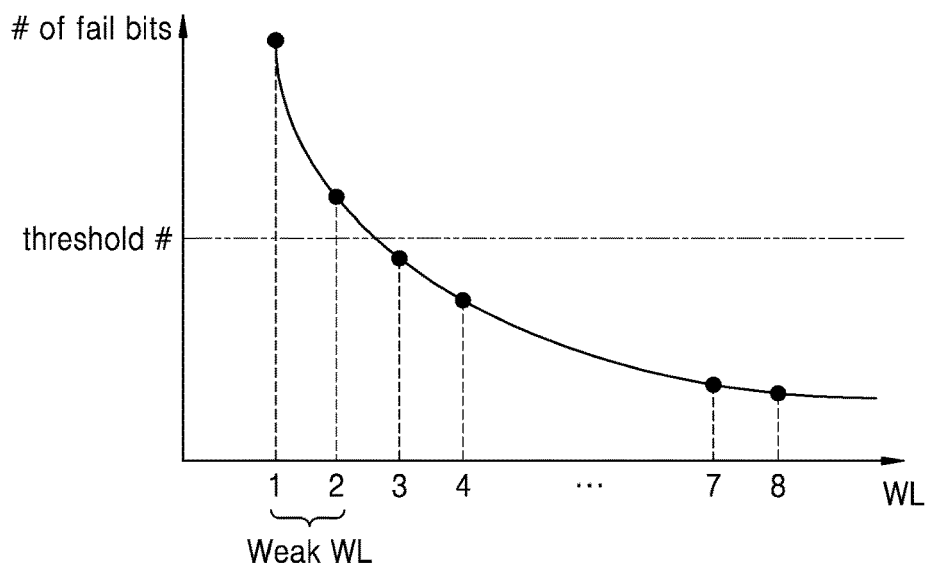
FIG. 10 is a diagram for describing a weak word line, according to an embodiment.

FIG. 10 is a diagram for describing a weak word line, according to an embodiment. Referring to FIG. 10, the number of fail bits in data read from each of the first through eighth word lines WL1 through WL8 may be counted. When the number of fail bits is greater than a threshold number, a read error may be determined. A word line, for which a read error is highly likely to be determined, may be referred to as a weak word line. For example, the first and second word lines WL1 and WL2 may be predefined as weak word lines in FIG. 10. A weak word line may be recorded in a program mode table of FIG. 12A.

A weak word line may include at least one word line connected to memory cells, of which the shift amount of the threshold voltage distribution is relatively large, as described above with reference to FIG. 9. Alternatively, a weak word line may include at least one word line connected to memory cells having a relatively narrow channel width, as described above with reference to FIGS. 7A through 8. As an alternative, a weak word line may include at least one word line closer to a substrate than other word lines.

Figure 11:
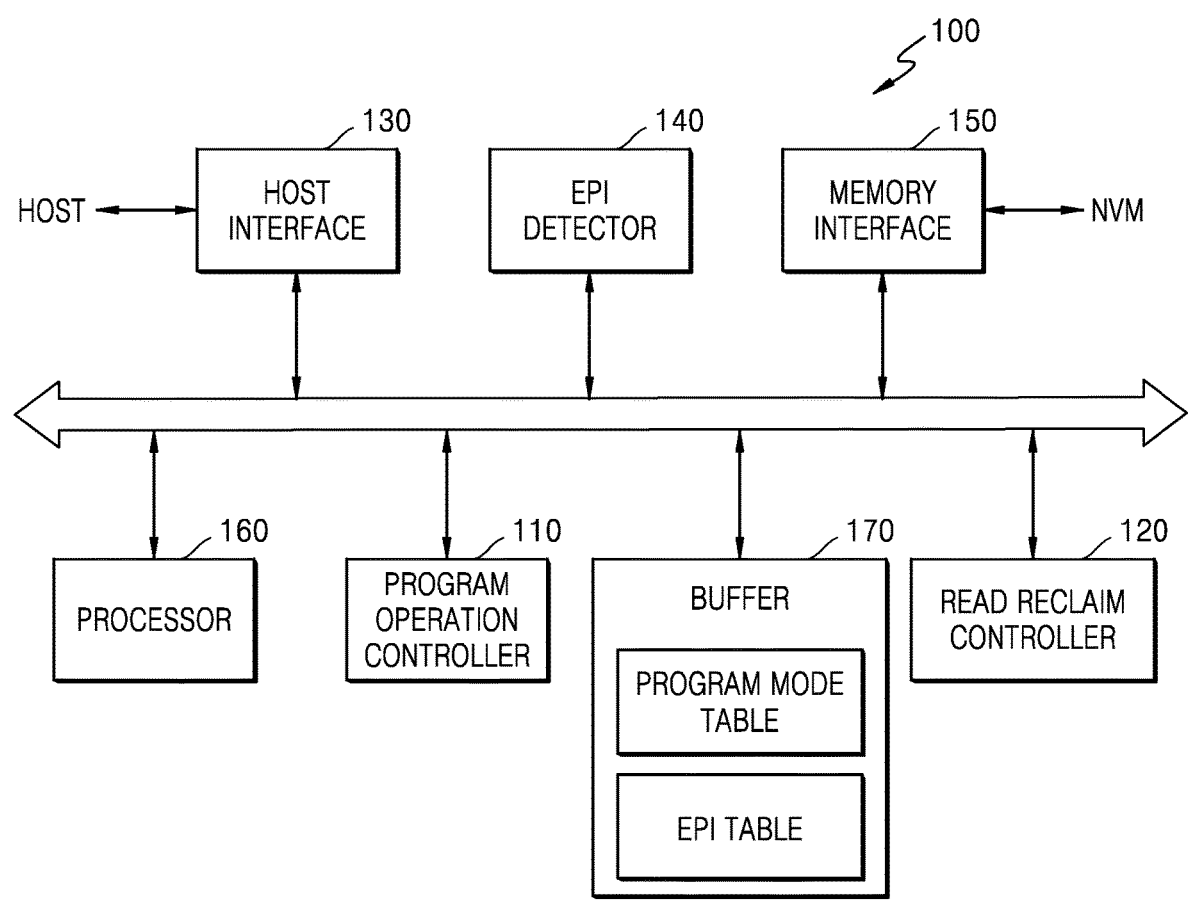
FIG. 11 is a block diagram of a memory controller according to an embodiment.

FIG. 11 is a block diagram of the memory controller 100 according to an embodiment. FIG. 12A shows a program mode table according to an embodiment. FIG. 12B shows an EPI table according to an embodiment. Referring to FIG. 11, the memory controller 100 may include the program operation controller 110, the read reclaim controller 120, a host interface 130, an EPI detector 140, a memory interface 150, a processor 160, and a buffer 170. Although not shown in FIG. 11, the memory controller 100 may further include other various elements, such as random access memory (RAM) temporarily storing various kinds of information and read-only memory (ROM) storing various kinds of information in a non-volatile fashion. The RAM may be used as working memory, and the processor 160 may generally control operations of the memory controller 100 by driving firmware loaded to the RAM. The RAM may include various kinds of memory. For example, the RAM may include at least one selected from cache memory, dynamic RAM (DRAM), static RAM (SRAM), PRAM, and flash memory. As an example of firmware, a flash translation layer (FTL) may be loaded to the RAM, and various functions related to flash memory operations may be performed by driving the FTL.

The host interface 130 may provide a physical connection between a host and the memory controller 100. For example, the host interface 130 may include various interfaces such as an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI express (PCIe) interface, an Institute of Electrical and Electronics Engineers (IEEE) 1394 interface, a universal serial bus (USB) interface, a secure digital (SD) card interface, a multimedia card (MMC) interface, an embedded MMC (eMMC) interface, and a compact flash (CF) card interface.

The memory interface 150 may provide a physical connection between the memory controller 100 and the NVM 200. For example, the command CMD, the address ADDR, and the data DATA may be exchanged between the memory controller 100 and the NVM 200 through the memory interface 150. Data requested by the host to be written to the NVM 200 and data read from the NVM 200 may be temporarily stored in the buffer 170.

The buffer 170 may store an EPI table. Referring to FIG. 12B, the EPI table may store EPI information corresponding to each memory block. For example, EPI information corresponding to the first memory block BLK1 may be stored as t1, and EPI information corresponding to the second memory block BLK2 may be stored as t2. In an embodiment, the EPI table may be stored in a meta area of the NVM 200.

The EPI detector 140 may detect an EPI of each memory block of the memory cell array 210 of the NVM 200 based on the EPI table. Alternatively, the EPI detector 140 may include at least one timer and detect an EPI of a memory block using the timer. The EPI detector 140 may include other various configurations for measuring time. For example, when the EPI detector 140 measures time based on clock counting, a counter may be included in the EPI detector 140. According to an embodiment, the memory cell array 210 may include a plurality of blocks, and a timer may be provided for each block. Alternatively, the memory system 10 may be configured to allow a single timer to be shared by the blocks or allow timers to be respectively provided for a plurality of pages included in each block.

The buffer 170 may load the program mode table, shown in FIG. 12A, from the NVM 200. Referring to FIG. 12A, the program mode table may store a type of a word line and a program mode corresponding to the word line. For example, according to the program mode table, the first and second word lines WL1 and WL2 are weak word lines, and memory cells connected to the first or second word line WL1 or WL2 may be programmed in the MLC mode. The third and fourth word lines WL3 and WL4 are normal word lines, and memory cells connected to the third or fourth word line WL3 and WL4 may be programmed in the SLC mode. The fifth word line WL5 may be a boundary word line, and memory cells connected to the fifth word line WL5 may be programmed in the MLC mode.

When the EPI of a memory block exceeds a reference time, the program operation controller 110 may program dummy data to the memory block. The program operation controller 110 may determine a program mode for the dummy data based on the program mode table, and provide the mode control signal MODE_CTRL corresponding to the determined program mode to the NVM 200. For example, when the dummy data is programmed to a memory cell connected to a weak word line, the program operation controller 110 may provide the mode control signal MODE_CTRL corresponding to the MLC mode to the NVM 200.

The read reclaim controller 120 may monitor a memory cell connected to a weak word line and perform a read reclaim operation on normal data. In detail, the read reclaim controller 120 may read dummy data from a weak page and, when the number of fail bits in the dummy data exceeds a reference number, may copy the normal data to another memory block.

Figure 13:
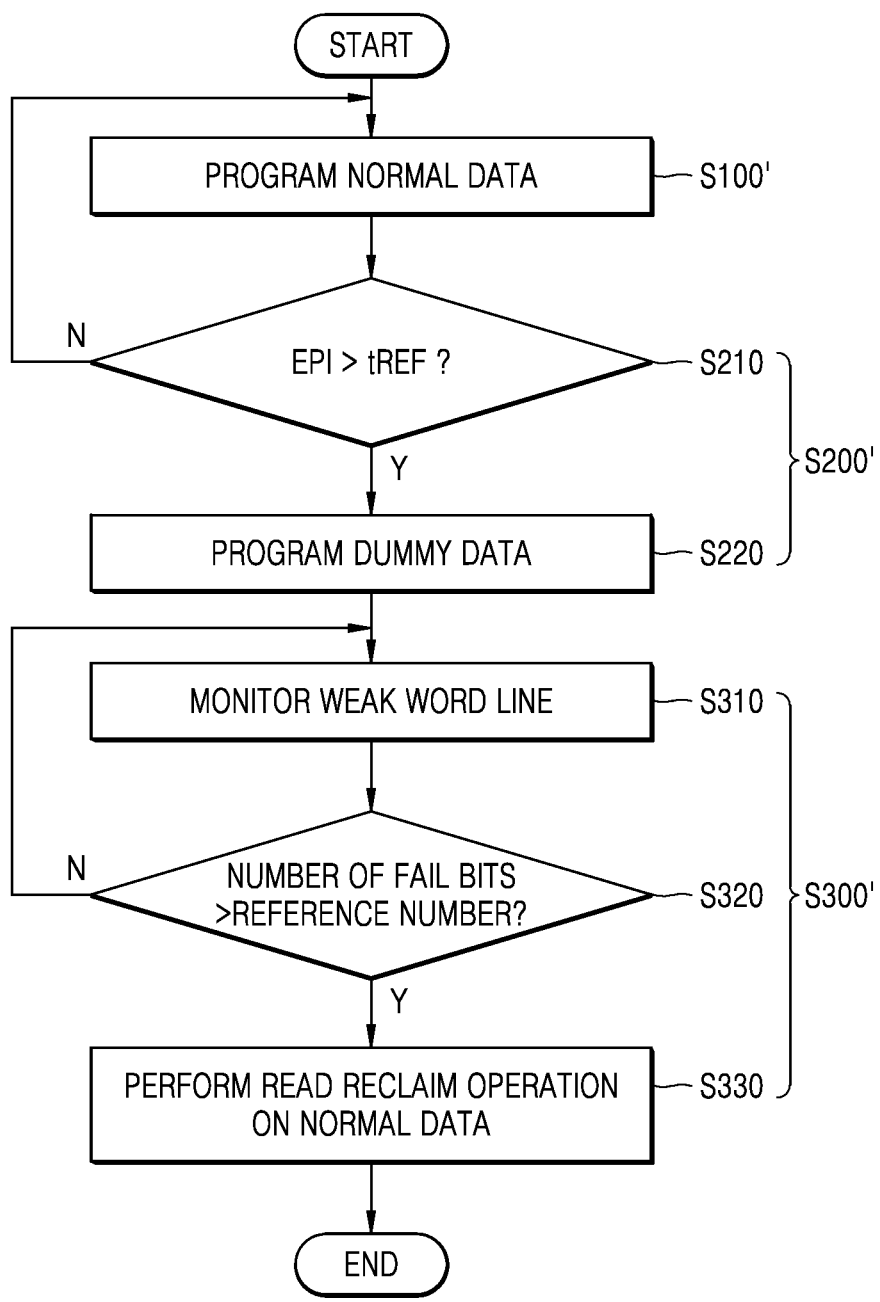
FIG. 13 is a flowchart of an operating method of a memory system, according to an embodiment.

FIG. 13 is a flowchart of an operating method of a memory system, according to an embodiment. Referring to FIG. 13, the operating method of a memory system may include a plurality of operations S100' through S300'.

The program operation controller 110 may program normal data to the first memory block BLK1 in operation S100'. The program operation controller 110 may provide the mode control signal MODE_CTRL corresponding to a predetermined first program mode, the normal data, and the address ADDR to the NVM 200 so that the normal data is programmed. For example, the normal data may be programmed to the sixth, seventh, and eighth pages PG6, PG7, and PG8 of the first memory block BLK1 in the MLC mode, as shown in FIGS. 5A through 5C. However, embodiments are not limited thereto.

Dummy data is programmed in operation S200', which may include a plurality of operations S210 and S220.

The program operation controller 110 may compare an EPI of the first memory block BLK1 with a reference time tREF in operation S210. The EPI of the memory block may be obtained by the EPI detector 140. When the EPI exceeds the reference time tREF, the memory system 10 may perform operation S220. When the EPI does not exceed the reference time tREF, the normal data may be programmed to the first memory block BLK1.

The program operation controller 110 may program the dummy data to the first memory block BLK1 in operation S220. The program operation controller 110 may provide the mode control signal MODE_CTRL corresponding to multiple program modes including the first program mode, the dummy data, and the address ADDR to the NVM 200 so that the dummy data is programmed. For example, the dummy data may be programmed to the first through fifth pages PG1 through PG5 of the first memory block BLK1 in the SLC mode or the MLC mode, as shown in FIGS. 5A through 5C. However, embodiments are not limited thereto.

A read reclaim operation may be performed in operation S300', which may include a plurality of operations S310, S320, and S330.

The read reclaim controller 120 may monitor a weak word line in operation S310. In detail, the read reclaim controller 120 may read dummy data from memory cells connected to a weak word line at a certain interval, and compare the number of fail bits with a reference number. When the number of fail bits exceeds the reference number in operation S320, operation S330 may be performed. When the number of fail bits does not exceed the reference number in operation S320, operation S310 may be performed.

The read reclaim controller 120 may perform a read reclaim operation by copying the normal data, which has been programmed to the first memory block BLK1, to the second memory block BLK2 in operation S330.

Figure 14:
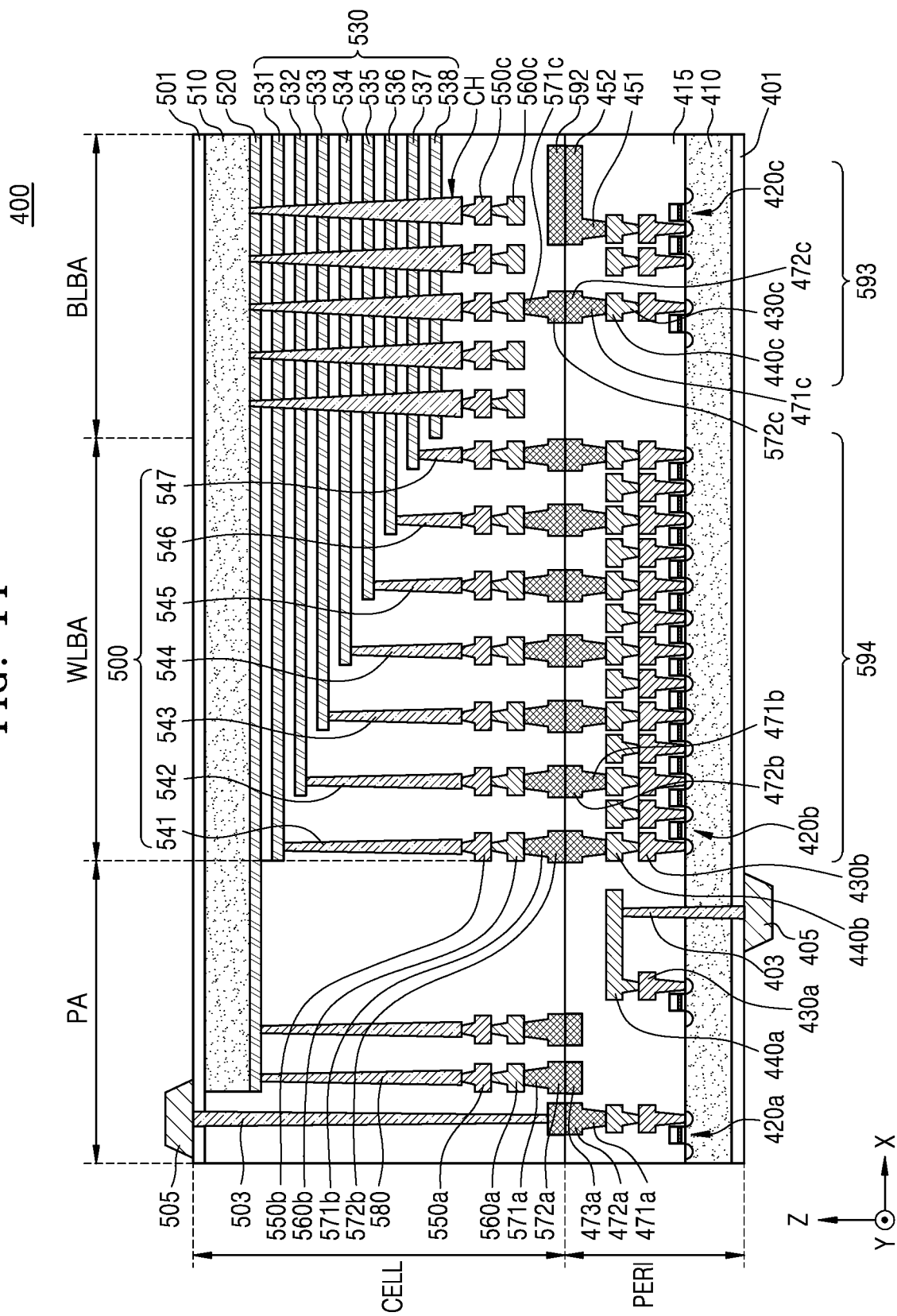
FIG. 14 is a diagram illustrating a memory device according to another embodiment.

FIG. 14 is a diagram illustrating a memory device according to another embodiment.

Referring to FIG. 14, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. The embodiment, however, may not be limited thereto. For example, the bonding metals may also be formed of aluminum (Al) or tungsten (W).

Each of the peripheral circuit region PERI and the cell region CELL of the memory device 400 may include an external pad bonding area PA, a word line bonding area WLBA, and a bit line bonding area BLBA.

The peripheral circuit region PERI may include a first substrate 410, an interlayer insulating layer 415, a plurality of circuit elements 420a, 420b, and 420c formed on the first substrate 410, first metal layers 430a, 430b, and 430c respectively connected to the plurality of circuit elements 420a, 420b, and 420c, and second metal layers 440a, 440b, and 440c formed on the first metal layers 430a, 430b, and 430c. In an embodiment, the first metal layers 430a, 430b, and 430c may be formed of tungsten having relatively high electrical resistivity, and the second metal layers 440a, 440b, and 440c may be formed of copper having relatively low electrical resistivity.

In an embodiment illustrated in FIG. 14, although only the first metal layers 430a, 430b, and 430c and the second metal layers 440a, 440b, and 440c are shown and described, the embodiment is not limited thereto, and one or more additional metal layers may be further formed on the second metal layers 440a, 440b, and 440c. At least a portion of the one or more additional metal layers formed on the second metal layers 440a, 440b, and 440c may be formed of aluminum or the like having a lower electrical resistivity than those of copper forming the second metal layers 440a, 440b, and 440c.

The interlayer insulating layer 415 may be disposed on the first substrate 410, and cover the plurality of circuit elements 420a, 420b, and 420c, the first metal layers 430a, 430b, and 430c, and the second metal layers 440a, 440b, and 440c. The interlayer insulating layer 415 may include an insulating material such as silicon oxide, silicon nitride, or the like.

Lower bonding metals 471b and 472b may be formed on the second metal layer 440b in the word line bonding area WLBA. In the word line bonding area WLBA, the lower bonding metals 471b and 472b in the peripheral circuit region PERI may be electrically bonded to upper bonding metals 571b and 572b of the cell region CELL. The lower bonding metals 471b and 472b and the upper bonding metals 571b and 572b may be formed of aluminum, copper, tungsten, or the like. Further, the upper bonding metals 571b and 572b in the cell region CELL may be referred as first metal pads and the lower bonding metals 471b and 472b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a direction (a Z-axis direction), perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in a direction (a Z-axis direction), perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an embodiment, the second metal layer 560c may extend in a first direction (a Y-axis direction), parallel to the upper surface of the second substrate 510.

In an embodiment illustrated in FIG. 14, an area in which the channel structure CH, the bit line 560c, and the like are disposed may be defined as the bit line bonding area BLBA. In the bit line bonding area BLBA, the second metal layer 560c may be electrically connected to the circuit elements 420c providing a page buffer 593 in the peripheral circuit region PERI. The second metal layer 560c may be connected to upper bonding metals 571c and 572c in the cell region CELL, and the upper bonding metals 571c and 572c may be connected to lower bonding metals 471c and 472c connected to the circuit elements 420c of the page buffer 593.

In the word line bonding area WLBA, the plurality of word lines 530 may extend in a second direction (an X-axis direction), parallel to the upper surface of the second substrate 510 and perpendicular to the first direction, and may be connected to a plurality of cell contact plugs 541 to 547 (i.e., 500). The plurality of word lines 530 and the plurality of cell contact plugs 540 may be connected to each other in pads provided by at least a portion of the plurality of word lines 530 extending in different lengths in the second direction. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 471b and 472b of the peripheral circuit region PERI in the word line bonding area WLBA.

The plurality of cell contact plugs 540 may be electrically connected to the circuit elements 420b forming a row decoder 594 in the peripheral circuit region PERI. In an embodiment, operating voltages of the circuit elements 420b of the row decoder 594 may be different than operating voltages of the circuit elements 420c forming the page buffer 593. For example, operating voltages of the circuit elements 420c forming the page buffer 593 may be greater than operating voltages of the circuit elements 420b forming the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

A first input-output pad 405 and a second input-output pad 505 may be disposed in the external pad bonding area PA. Referring to FIG. 14, a lower insulating film 401 covering a lower surface of the first substrate 410 may be formed below the first substrate 410, and a first input-output pad 405 may be formed on the lower insulating film 401. The first input-output pad 405 may be connected to at least one of the plurality of circuit elements 420a, 420b, and 420c disposed in the peripheral circuit region PERI through a first input-output contact plug 403, and may be separated from the first substrate 410 by the lower insulating film 401. In addition, a side insulating film may be disposed between the first input-output contact plug 403 and the first substrate 410 to electrically separate the first input-output contact plug 403 and the first substrate 410.

Referring to FIG. 14, an upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 420a, 420b, and 420c disposed in the peripheral circuit region PERI through a second input-output contact plug 503. In the embodiment, the second input-output pad 505 is electrically connected to a circuit element 420a.

According to embodiments, the second substrate 510 and the common source line 520 may not be disposed in an area in which the second input-output contact plug 503 is disposed. Also, the second input-output pad 505 may not overlap the word lines 530 in the third direction (the Z-axis direction). Referring to FIG. 14, the second input-output contact plug 503 may be separated from the second substrate 510 in a direction, parallel to the upper surface of the second substrate 510, and may pass through the interlayer insulating layer 515 of the cell region CELL to be connected to the second input-output pad 505.

According to embodiments, the first input-output pad 405 and the second input-output pad 505 may be selectively formed. For example, the memory device 400 may include only the first input-output pad 405 disposed on the first substrate 410 or the second input-output pad 505 disposed on the second substrate 510. Alternatively, the memory device 400 may include both the first input-output pad 405 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 473a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 473a formed in the uppermost metal layer of the peripheral circuit region PERI may not be connected to a contact. Similarly, in the external pad bonding area PA, an upper metal pattern 572a, corresponding to the lower metal pattern 473a formed in an uppermost metal layer of the peripheral circuit region PERI, and having the same shape as a lower metal pattern 473a of the peripheral circuit region PERI, may be formed in an uppermost metal layer of the cell region CELL.

The lower bonding metals 471b and 472b may be formed on the second metal layer 440b in the word line bonding area WLBA. In the word line bonding area WLBA, the lower bonding metals 471b and 472b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 452 formed in the uppermost metal layer of the peripheral circuit region PERI, and having the same cross-sectional shape as the lower metal pattern 452 of the peripheral circuit region PERI, may be formed in an uppermost metal layer of the cell region CELL. A contact may not be formed on the upper metal pattern 592 formed in the uppermost metal layer of the cell region CELL.

In an embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 15:
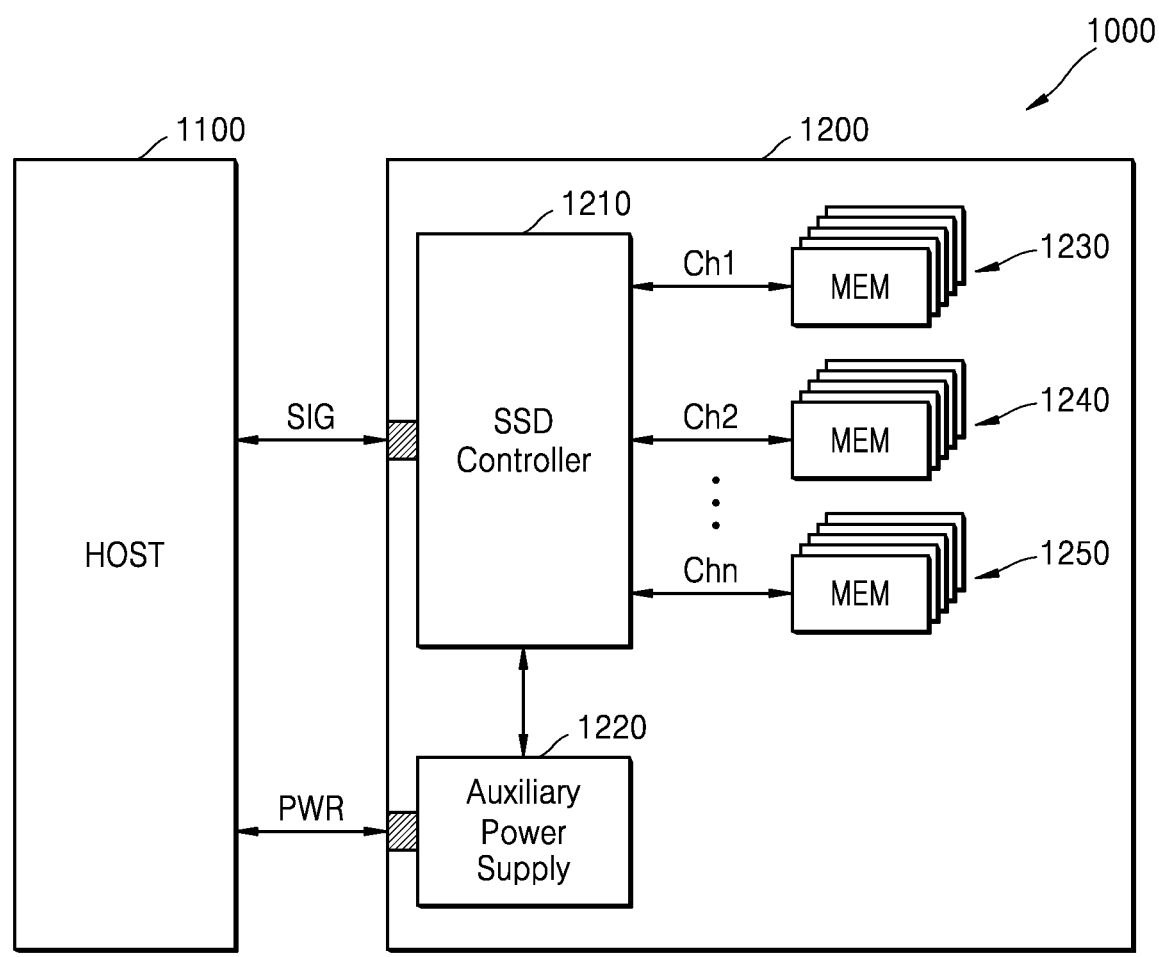
FIG. 15 is a block diagram of an example of applying a memory system to a solid state drive (SSD) system, according to embodiments.

FIG. 15 is a block diagram of an example of applying a memory system to an SSD system, according to embodiments.

Referring to FIG. 15, an SSD system 1000 may include a host 1100 and an SSD 1200. The SSD 1200 may exchange signals SIG with the host 1100 through a signal connector and may receive power PWR through a power connector. The SSD 1200 may include an SSD controller 1210, an auxiliary power supply 1220, and memory devices 1230, 1240, and 1250. The memory devices 1230, 1240, and 1250 may be connected to the SSD controller 1210 through channels Ch1, Ch2, and Chn, respectively.

The SSD controller 1210 may be implemented using the memory controller 100 described above with reference to FIGS. 1 through 13. In detail, the SSD controller 1210 may program dummy data to in multiple program modes. The SSD controller 1210 may also detect an EPI of a memory block and program dummy data to the memory block based on the EPI. In addition, the SSD controller 1210 may monitor dummy data of a memory cell connected to a weak word line and perform a read reclaim operation on normal data programmed to a memory block.

Each of the memory devices 1230, 1240, and 1250 may be implemented using the NVM 200 described above with reference to FIGS. 1 through 14. In detail, each of the memory devices 1230, 1240, and 1250 may perform a program operation on normal data or dummy data based on the mode control signal MODE_CTRL received from the SSD controller 1210.

At least one of the components, elements, modules or units (collectively "components" in this paragraph) represented by a block in the drawings may be embodied as various numbers of hardware, software and/or firmware structures that execute respective functions described above, according to an example embodiment. These components may include the program operation controller 110, the read reclaim controller 120, the control logic 220 and the EPI detector shown in FIGS. 1 and 11, not being limited thereto. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the inventive concept has been particularly shown and described with reference to embodiments thereof, it will be understood that various changes in form and details may be made therein without departing from the spirit and scope of the following claims.

What is claimed is:

1. An operating method of a memory system including a non-volatile memory, the operating method comprising:
storing normal data in a first storage area of the non-volatile memory in a first program mode among multiple program modes defined according to a number of bits stored in a memory cell of the non-volatile memory;
storing dummy data in the first storage area in at least one of the multiple program modes; and
copying the normal data from the first storage area to a second storage area of the non-volatile memory based on the dummy data stored in the first program mode,
wherein, in the first program mode, at least two bits are stored in the memory cell of the non-volatile memory, and
wherein the storing the dummy data in the first storage area in the at least one of the multiple program modes is performed based on a time period between a time when the first storage area is erased and a time when the first storage area is stored with the normal data.

2. The operating method of claim 1, wherein the first storage area comprises memory cells connected to a plurality of word lines including a first word line and a second word line, the first word line being distinguished from the second word line based on a number of fail bits involved in a read operation, and
wherein the storing the dummy data in the first storage area in one of the multiple program modes comprises:
storing the dummy data in at least one memory cell connected to the first word line in the first program mode; and
storing the dummy data in at least one memory cell connected to the second word line in at least one second program mode that is different from the first program mode.

3. The operating method of claim 2, wherein a number of fail bits in a read operation of the first word line is greater than a number of fail bits in a read operation of the second word line, and
wherein a number of bits stored in each memory cell in the first program mode is greater than a number of bits stored in each memory cell in the second program mode.

4. The operating method of claim 1, wherein the first storage area includes memory cells connected to a plurality of word lines vertically stacked on a substrate, and
wherein the storing the dummy data in the first storage area in the one of the multiple program modes comprises storing the dummy data in memory cells connected to at least one word line in the first program mode, the at least one word line being adjacent to the substrate among the plurality of word lines.

5. The operating method of claim 4, wherein the storing the dummy data in the first storage area in the one of the multiple program modes comprises storing the dummy data in memory cells connected to a word line in at least one second program mode that is different from the first program mode, the word line being formed above the at least one word line among the plurality of word lines.

6. The operating method of claim 1, wherein the copying the normal data from the first storage area to the second storage area of the non-volatile memory based on the dummy data stored in the first program mode comprises:
reading the dummy data stored in the first program mode;
counting a number of fail bits in the read dummy data; and
copying the normal data from the first storage area to the second storage area based on a result of comparing the number of fail bits with a reference number.

7. The operating method of claim 1, wherein the dummy data is stored in an entire region of the first storage area where the normal data is not stored.

8. A memory controller for controlling a non-volatile memory comprising a plurality of storage areas each comprising at least one memory cell, the memory controller comprising:
a host interface configured to provide an interface with a host; and
at least one processor configured to implement a program operation controller configured to control the non-volatile memory to store normal data received from the host in a first storage area in a first program mode among multiple program modes defined according to a number of bits stored in a memory cell of the non-volatile memory,
wherein the program operation controller is further configured to control the non-volatile memory to store dummy data in the first storage area in the first program mode in which at least two bits are stored in the memory cell of the non-volatile memory, and
wherein the at least one processor is further configured to implement an erase-program interval (EPI) detector configured to obtain an EPI indicating a time period between a time when each of the plurality of storage areas is erased and a time when the each of the plurality of storage areas is stored with the normal data.

9. The memory controller of claim 8,
wherein the program operation controller is further configured to output information about the multiple program modes to the non-volatile memory, and store the dummy data to the first storage area based on the EPI of the first storage area.

10. The memory controller of claim 8, further comprising a memory storing a program mode table indicating a program mode corresponding to each of a plurality of word lines connected to memory cells included in the first storage area,
wherein the program operation controller is further configured to control the non-volatile memory to store the dummy data in the first storage area in at least one program mode, among the multiple program modes, determined based on the program mode table.

11. The memory controller of claim 10, wherein the program mode table matches the first program mode with a first word line having a number of fail bits exceeding a reference number, the fail bits occurring in a read operation.

12. The memory controller of claim 11, wherein the program mode table matches other word lines than the first word line with at least one second program mode allowing a smaller number of bits to be stored in a memory cell than the first program mode.

13. The memory controller of claim 8, wherein the at least one processor is further configured to implement a read reclaim controller configured to copy the normal data from the first storage area to a second storage area based on the dummy data stored in the first storage area in the first program mode.

14. The memory controller of claim 13, wherein the read reclaim controller is configured to read the dummy data stored in the first program mode, count a number of fail bits in the read dummy data, and copy the normal data from the first storage area to the second storage area based on a result of comparing the number of fail bits with a reference number.

15. A memory system comprising:
a memory device comprising a first storage area and a second storage area; and
at least one processor configured to implement a memory controller configured to control the memory device to store normal data received from a host in the first storage area in a first program mode among multiple program modes defined according to a number of bits stored in a memory cell of the first storage area, and control the memory device to store dummy data in the first storage area in the first program mode and at least one second program mode that is different from the first program mode,
wherein the memory controller is further configured to control the memory device to store the dummy data in the first storage area based on a result of comparing a reference time with a time period between a time when the first storage area is erased and a time when the first storage area is stored.

16. The memory system of claim 15, wherein the first storage area comprises memory cells connected to a plurality of word lines vertically stacked on a substrate,
wherein the memory controller is further configured to control the memory device to store the dummy data in at least one memory cell connected to at least one word line in the first program mode, the at least one word line being adjacent to the substrate among the plurality of word lines.

17. The memory system of claim 16, wherein the memory controller is further configured to control the memory device to store the dummy data in at least one memory cell connected to a word line in the second program mode, the word line being formed above the at least one word line.

18. The memory system of claim 15, wherein the memory controller is further configured to copy the normal data from the first storage area to the second storage area based on the dummy data in the first program mode.

* * * * *